(12) United States Patent
Furuta et al.

(10) Patent No.: US 8,546,151 B2
(45) Date of Patent: Oct. 1, 2013

(54) METHOD FOR MANUFACTURING MAGNETIC STORAGE DEVICE AND MAGNETIC STORAGE DEVICE

(75) Inventors: Haruo Furuta, Tokyo (JP); Shuichi Ueno, Tokyo (JP); Ryoji Matsuda, Tokyo (JP); Tatsuya Fukumura, Tokyo (JP); Takeharu Kuroiwa, Tokyo (JP); Lien-Chang Wang, Milpitas, CA (US); Eugene Chen, Milpitas, CA (US); Yiming Huai, Milpitas, CA (US)

(73) Assignee: Renesas Electronics Corporation, Kanagawa (JP)

( * ) Notice: Subject to any disclaimer, the term of this patent is extended or adjusted under 35 U.S.C. 154(b) by 711 days.

(21) Appl. No.: 12/528,854

(22) PCT Filed: Feb. 25, 2008

(86) PCT No.: PCT/JP2008/053197
§ 371 (c)(1),
(2), (4) Date: Jun. 25, 2010

(87) PCT Pub. No.: WO2008/105372
PCT Pub. Date: Sep. 4, 2008

(65) Prior Publication Data
US 2010/0264501 A1 Oct. 21, 2010

(30) Foreign Application Priority Data
Feb. 27, 2007 (JP) ................................. 2007-046776

(51) Int. Cl.
*H01L 21/00* (2006.01)
(52) U.S. Cl.
USPC .. 438/3; 257/421; 257/E21.002; 257/E29.323
(58) Field of Classification Search
USPC ............... 257/421, E21.002, E29.323; 438/3
See application file for complete search history.

(56) References Cited

U.S. PATENT DOCUMENTS 6,555,858 B1 4/2003 Jones et al.
6,849,888 B2 2/2005 Ooishi
(Continued)

FOREIGN PATENT DOCUMENTS

JP 2002-246565 A 8/2002
JP 2004-119478 4/2004
(Continued)

OTHER PUBLICATIONS

International Preliminary Report on Patentability with Written Opinion of the International Searching Authority, issued in International Patent Application No. PCT/JP2008/053197, mailed Sep. 11, 2009.
(Continued)

*Primary Examiner* — Marvin Payen
(74) *Attorney, Agent, or Firm* — McDermott Will & Emery LLP

(57) ABSTRACT

Disclosed is a method for manufacturing a magnetic storage device comprising a TMR element, which comprises a step for forming an insulting film on an interlayer insulating film provided with a wiring layer, an opening formation step for forming an opening in the insulating film so that the wiring layer is exposed therefrom, a metal layer formation step for forming a metal layer on the insulating layer so that the opening is filled therewith, a CMP step for polishing and removing the metal layer on the insulating layer by a CMP method and forming the metal layer remaining in the opening into a lower electrode, and a step for forming a TMR element on the lower electrode. Also disclosed is a magnetic storage device comprising an interlayer insulating film provided with a wiring layer, an insulating film formed on the interlayer insulating film, an opening formed in the insulating film so that the wiring layer is exposed therefrom, a barrier metal layer provided so as to cover the inner surface of the opening, a lower electrode formed on the barrier metal so as to fill the opening, and a TMR element formed on the lower electrode.

2 Claims, 37 Drawing Sheets

(56) References Cited

U.S. PATENT DOCUMENTS

2002/0109172 A1 8/2002 Okazawa
2003/0151079 A1 8/2003 Jones et al.
2004/0056289 A1 3/2004 Ooishi

FOREIGN PATENT DOCUMENTS

JP   2004-514286   5/2004
WO   WO 02/041367 A3 *  5/2002

OTHER PUBLICATIONS

Japanese Office Action, and English translation thereof, issued in Japanese Patent Application No. 2007-046776 dated May 8, 2012.

* cited by examiner (a)　　　(b)　　　(c)

(a)　　　(b)　　　(c)

(a)　　　(b)　　　(c)

METHOD FOR MANUFACTURING MAGNETIC STORAGE DEVICE AND MAGNETIC STORAGE DEVICE

RELATED APPLICATIONS

This application is the U.S. National Phase under 35 U.S.C. §371 of International Application No. PCT/JP2008/053197, filed on Feb. 25, 2008, which in turn claims the benefit of Japanese Application No. 2007-046776, filed on Feb. 27, 2007, the disclosures of which Applications are incorporated by reference herein.

TECHNICAL FIELD

The present invention relates to a method for manufacturing a magnetic storage device and a structure thereof, and in particular, concerns a method for manufacturing a nonvolatile magnetic storage device that can reduce characteristic variation of a memory cell and a structure thereof.

BACKGROUND ART

FIGS. 42(a) and (b) are cross-sectional views each showing a nonvolatile magnetic storage device (a Magnetoresistive Random Access Memory, hereinafter, referred to as an "MRAM") in a conventional structure, the entire structure of which is indicated by reference numeral 500. FIG. 42(a) is a cross-sectional view showing a single cell, and FIG. 42(b) is an enlarged view showing a TMR (Tunneling Magneto-Resistance) element. The TMR element is also referred to as a MTJ (Magnetic Tunneling Junction) element.

On an interlayer insulating film 23, there are formed an interlayer insulating film 27 as well as a lower electrode (leading line) 28 of a TMR element 50, which is connected to a wiring layer (digit line 24) 25 through a via-hole. On the lower electrode 28, the TMR element 50 and an upper electrode 29 of the TMR element 50 are formed.

As shown in FIG. 42(b), the TMR element 50 is configured by a lower magnetic film 51, an upper magnetic film 52, and a tunnel insulating film 53 sandwiched therebetween.

An inner insulating film 30 is formed on the upper electrode 29. An opening that reaches the upper electrode 29 is formed in the interlayer insulating film 30, and a wiring layer (bit line) 32 is formed therein with a barrier metal layer 132 interposed therebetween.

In a storing operation of the MRAM 500, by applying a composite magnetic field, which is induced by an electric current allowed to flow through the digit line 24 and the bit line 32, to the TMR element 50, while the magnetic direction of the lower magnetic film (pin layer) 51 being fixed, the magnetic direction of the upper magnetic film (free layer) 52 is inverted so that a data writing operation is carried out. Depending on states where the magnetic direction of the upper magnetic film 52 is the same as (parallel to) the magnetic direction of the lower magnetic film 51 and where being opposite (anti-parallel) to the magnetic direction of the lower magnetic film 51, the resistance value of a tunnel current flowing through the tunnel insulating film 53 is made different from each other when the current is allowed to flow through the memory cell 50, and is difference in resistance value corresponds to "0" and "1" in the memory (JP 2004-119478, A).

DISCLOSURE OF THE INVENTION

Problems to be Solved by the Invention

In the MRAM 500, it is necessary to reduce characteristic variation between the respective TMR elements 50 forming the MRAM 500. In particular, the tunnel insulating film 53 needs to have a uniform film thickness so as to maintain an insulating property between the lower magnetic film 51 and the upper magnetic film 52 and also to set the value of the tunnel current allowed to flow upon carrying out a read-out process to a substantially constant value.

However, the conventional MRAM 500 has a problem that there are irregularities in the read-out currents between the respective TMR elements 50 forming the MRAM 500. In particular, this tendency becomes conspicuous as the MRAM 500 is miniaturized and highly integrated.

Another problem is that a short circuit occurs between the lower magnetic film 51 and the upper magnetic film 52 to cause a reduction in the production yield.

In view of these problems, as a result of a dedicated examination made by the inventors, they have found that the flatness of the top face of the lower electrode 28 on which the TMR element 50 is mounted gives great influences to the uniformity of the film thickness of the tunnel insulating film 53.

Moreover, the inventors have also found that, since, in the conventional manufacturing method the etching process of the lower electrode 28 is carried out after forming the TMR element 50, a foreign matter tends to adhere to a side face of the TMR element 50 in the etching process of the lower electrode 28 to cause a short circuit between the lower magnetic film 51 and the upper magnetic film 52.

An objective of the present invention is therefore to provide a method for manufacturing and a structure of a nonvolatile magnetic memory that can reduce the characteristic variation between the TMR elements as well as can provide a high production yield.

Means for Solving the Problems

In accordance with one embodiment of the present invention, there is provided a method for manufacturing a magnetic storage device having a TMR element. The method includes the steps of: forming an insulating film on an interlayer insulating film provided with a wiring layer; forming an opening in the insulating film so that the wiring layer is exposed therefrom; forming a metal layer on the insulating layer so that the opening is filled therewith; polishing and removing the metal layer on the insulating layer by a CMP method and forming the metal layer remaining in the opening into a lower electrode; and forming a TMR element on the lower electrode.

Moreover, in accordance with another embodiment of the present invention, there is provided a magnetic storage device having a TMR element. The device includes: an interlayer insulating film provided with a wiring layer; an insulating film formed on the interlayer insulating film; an opening formed in the insulating film so that the wiring layer is exposed therefrom; a barrier metal layer formed so as to cover an inner face of the opening; a lower electrode formed on the barrier metal layer so that the opening is filled therewith; and the TMR element formed on the lower electrode.

Effects of the Invention

As described above, in accordance with one embodiment of the present invention, it is possible to provide a nonvolatile magnetic memory that can reduce the characteristic variation between the TMR elements and can provide a high production yield. In accordance with another embodiment of the present invention, it is possible to provide a nonvolatile magnetic memory that has superior characteristics.

BEST MODE FOR CARRYING OUT THE INVENTION

Embodiment 1

FIGS. 1(a) and 1(b) each show an MRAM in accordance with embodiment 1, the entire structure of which is indicated by reference numeral 100, and FIG. 1(a) is a schematic view, and FIG. 1(b) is a circuit block diagram, respectively.

As shown in FIG. 1(a), the MRAM 100 includes a TMR element 50. The TMR element 50 is formed on a lower electrode (leading electrode) 28, and is electrically connected to the lower electrode 28. The lower electrode 28 is electrically connected to a transistor 15. A digit line 25 is disposed below the TMR element 50.

The TMR element 50 is also connected to a bit line 32. The bit line 32 and the digit line 25 are disposed in directions substantially orthogonal to each other, so that the direction of a magnetic field of a free layer of the TMR element 50 is changed by a composite magnetic field caused by electric currents flowing through these lines.

FIGS. 2(a) and 2(b) are enlarged views each showing a memory cell 150 of FIG. 1(a), and FIG. 2(a) is a top view, and FIG. 2(b) is a cross-sectional view showing a portion near the TMR element. Moreover, FIGS. 3(a) to 3(c) are cross-sectional views of the MRAM 100, and FIG. 3(a) is a cross-sectional view taken along the A-A direction in FIG. 2(a), FIG. 3(b) is a cross-sectional view taken along the B-B direction in FIG. 2(a), and FIG. 3(c) is a cross-sectional view taken along the C-C direction in FIG. 2(a). In FIGS. 2(a) to 3(c), the same reference numerals as those in FIGS. 42(a) and 42(b) indicate the same or corresponding portions.

As shown in FIGS. 3(a) to 3(c), the MRAM 100 in accordance with embodiment 1 includes an n-type semiconductor substrate 10. A p-type well region 1 is formed in the semiconductor substrate 10 so as to be sandwiched by isolation regions 2. On the p-type well region 1, a gate electrode 12 is formed with a gate oxide film 11 interposed therebetween. On a side wall of the gate electrode 12, a side wall 13 is formed with an insulating film 14 interposed therebetween.

In the p-type well region 1, an n-type source/drain region 4 is formed so as to sandwich the gate electrode 12. The well region 1 on the lower portion of the gate electrode 12, which is sandwiched by the source/drain region 4, is allowed to form a channel region. Furthermore, a silicide layer 5 is formed on the source/drain region 4. The above-mentioned portions constitute a switching transistor 15 of the MRAM.

An interlayer insulating film 16 is formed on the transistor. An opening that reaches the silicide layer 5 is formed in the interlayer insulating film 16, and a contact plug 17 is formed therein with a barrier metal layer 117 interposed therebetween.

On the interlayer insulating film 16, interlayer insulating films 118 and 18 are formed. Openings that reach the contact plug 17 are formed in the interlayer insulating films 118 and 18, and a first wiring layer 19 is formed therein with a barrier metal layer 119 interposed therebetween.

On the interlayer insulating film 18, interlayer insulating films 120 and 20 are formed. Openings that reach the wiring layer 19 are formed in the interlayer insulating films 120 and 20, and a second wiring layer 22 is formed therein with a barrier metal layer 122 interposed therebetween.

On the interlayer insulating film 20, interlayer insulating films 123 and 23 are formed. Openings that reach the wiring layer 22 are formed in the interlayer insulating films 123 and 23, and a third wiring layer (digit line 24) 25 is formed therein with a barrier metal layer 125 interposed therebetween.

As clearly shown in FIG. 2(b), in the MRAM 100 in accordance with the present embodiment 1, an interlayer insulating film 26 made from silicon nitride or the like, and an interlayer insulating film 27 made from silicon oxide or the like are laminated on the third wiring layer (digit line 24) 25 and the interlayer insulating film 23. Moreover, via-holes are formed in the interlayer insulating films 26 and 27, and a barrier metal layer 128 and the lower electrode 28 are formed so as to be embedded therein. Since the lower electrode (leading line) 28 is made from tantalum or the like and is formed by using the CMP method, it has a very flat surface (which will be described later in detail in the description of the manufacturing method).

The TMR element 50 and an upper electrode 29 are formed on the lower electrode 28. The TMR element 50 is configured by a lower magnetic film 51, an upper magnetic film 52, and a tunnel insulating film 53 that is sandwiched therebetween. The upper side of the TMR element 50 is connected to a fourth wiring layer (bit line) 32 formed on the interlayer insulating films 30 and 130 through the via-holes.

Referring next to FIGS. 4(a) to 25(d), the following description will discuss a method for manufacturing the MRAM 100 in accordance with embodiment 1. Among FIGS. 4(a) to 25(d), FIGS. 4(a) to 4(c) through FIGS. 25(a) to 25(c) are cross-sectional views respectively taken along the A-A direction, the B-B direction and the C-C direction in FIG. 2(a). In FIGS. 4(a) to 25(d), the same reference numerals as those in FIGS. 42(a) and 42(b) indicate the same or corresponding portions.

The method for manufacturing the MRAM 100 according to the present embodiment 1 includes the following processes 1 to 22.

Process 1: As shown in FIGS. 4(a) to 4(c), an isolation region 2, such as an STI (Shallow Trench Isolation), is formed on the semiconductor substrate 10 made from silicon or the like.

Process 2: As shown in FIGS. 5(a) to 5(c), first, a thermal oxide film (not shown) is formed on the surface of the semiconductor substrate 10. Next, a p-type well region 1 is formed by using an ion implantation method. For example, boron is implanted thereto under conditions of an acceleration voltage: 200 keV to 500 keV and an impurity concentration: $5 \times 10^{12}$ to $1 \times 10^{14}/cm^2$, and further implanted under conditions of an acceleration voltage: 15 keV to 70 keV and an impurity concentration: $3 \times 10^{12}$ to $5 \times 10^{13}/cm^2$.

Process 3: As shown in FIGS. 6(a) to 6(c), after the thermal oxide film has been removed, a gate insulating film 11, made from silicon oxide or the like is formed thereon. Moreover, a gate electrode 12, made from polycrystalline silicon or the like is formed thereon.

Process 4: As shown in FIGS. 7(a) to 7(c), after a side wall 13 has been formed on a side wall of the gate electrode 12 with an insulating film 24 interposed therebetween, for example, arsenic is ion-implanted to the p-type well region 1 so that an n-type source/drain region 4 is formed. The ion implantation is carried out, for example, under conditions of an acceleration voltage: 3 keV to 100 keV and an impurity concentration: $5 \times 10^{13}$ to $5 \times 10^{15}/cm^2$.

Process 5: As shown in FIGS. 8(a) to 8(c), for example, a cobalt layer is deposited on the entire surface, and this is subjected to a heating treatment so that a silicide layer 5 made from cobalt silicide is formed on the surface of the source/drain region 4. After the formation of the silicide layer 5 made from cobalt silicide, an unreacted cobalt layer is removed.

Process 6: As shown in FIGS. 9(a) to 9(c), for example, an interlayer insulating film 16 made from silicon oxide has been formed, an opening is formed so that the silicide layer 5 on the source/drain region 4 is exposed, and a barrier metal layer 117 and a plug 17 are embedded into the opening. The barrier metal layer 117 is, for example, made from Ti/Ti, and the plug 17 is made from tungsten.

Process 7: As shown in FIGS. 10(a) to 10(c), an interlayer insulating film 118, for example, made from silicon nitride, and an interlayer insulating film 18, for example, made from silicon oxide, are formed. Next, an opening is formed so as to allow the surface of the plug 17 to be exposed, and a barrier metal layer 119 and a wiring layer 19 are embedded therein. Upon etching the interlayer insulating film 118 made from silicon nitride, for example, an RIE process using, for example, a $CHF_3$-based gas, is used. Moreover, upon etching the interlayer insulating film 18 made from silicon oxide, for example, an RIE process using, for example, $CF_4$-based gas, is used. The barrier metal layer 119 is made from TaN/Ta or the like, and the wiring layer 19 is made of copper.

Process 8: As shown in FIGS. 11(a) to 11(c), for example, an interlayer insulating film 120 made from silicon nitride and an interlayer insulating film 20 made from silicon oxide are formed, with an opening formed therein. Next, a barrier metal layer 122 and a wiring layer 22 are embedded into the opening by using a damascene technique. The barrier metal layer 122 is made from TaN/Ta or the like, and the wiring layer 22 is made from copper or the like. Thus, the wiring layer 22 serving as the second layer is formed. In addition to copper, tungsten or tantalum may be used as the wiring layer 22 (hereinafter, the same is true for the wiring layer 25 and the like).

Process 9: As shown in FIGS. 12(a) to 12(d), an interlayer insulating film 123 made from silicon nitride and an interlayer insulating film 23 made from silicon oxide are formed, with an opening formed therein. Next, a barrier metal layer 125 and wiring layers 24 and 25 are embedded into the opening by using a damascene technique. The barrier metal layer 125 is made from TaN/Ta or the like, and the wiring layers 24 and 25 are made from copper or the like. Thus, the wiring layer (digit line 24) 25 serving as the third layer is formed.

FIG. 12(d) is a cross-sectional view showing a peripheral circuit portion of the MRAM 100.

Process 10: As shown in FIGS. 13(a) to 13(d), an interlayer insulating film 26, made from silicon nitride or the like, and an interlayer insulating film 27, made from silicon oxide or the like, are successively deposited so as to cover the wiring layers 24, 25 and the interlayer insulating film 23. Successively, this is subjected to an anisotropic etching process by using a resist mask so that an opening 26a is formed so as to expose the surface of the wiring layer 25.

Process 11: As shown in FIGS. 14(a) to 14(d), further, by using an anisotropic etching process in which a resist mask is used, an opening 27a is formed in the interlayer insulating film 27.

Process 12: As shown in FIGS. 15(a) to 15(d), after forming a barrier metal layer 128 made from TiN/Ti or the like, so as to bury the openings 26a and 27a, a metal layer 228, for example, made of tungsten, is formed on the entire surface by using a CVD method.

Process 13: As shown in FIGS. 16(a) to 16(d), by using a damascene technique by the use of a CMP (Chemical Mechanical Polishing) method, the metal layer 228 is polished and removed from the upper portion thereof so that the metal layer 228 is left so as to be embedded into the opening portions 26a and 27a.

In the CMP process for the metal layer 228, for example, a silica-based slurry is used, and after the CMP process, a rinsing process is carried out. Thus, the remaining metal layer 228 is allowed to form a lower electrode (leading wire) 28.

Process 14: As shown in FIGS. 17(a) to 17(d), the lower magnetic film 51, tunnel insulating film 53 and upper magnetic film 52, which form the TMR element, are successively deposited by using a sputtering method and the like. The lower magnetic film 51 and the upper magnetic film 52 are made of ferromagnetic films, such as permalloy-based metal or the like, and the tunnel insulating film 53 is made from alumina, MgO, or the like.

Moreover, a metal layer 229, for example, made from tungsten, is deposited on the upper magnetic film 52.

Process 15: As shown in FIGS. 18(a) to 18(d), by using an RIE method and the like using a resist mask, the lower magnetic film 51, tunnel insulating film 53, upper magnetic film 52 and metal layer 229 are patterned so that a TMR element, made of the lower magnetic film 51, the tunnel insulating film 53 and the upper magnetic film 52, as well as the upper electrode 29, are formed.

Process 16: As shown in FIGS. 19(a) to 19(d), for example, an interlayer insulating film 130 made from silicon nitride or the like is deposited.

Process 17: As shown in FIGS. 20(a) to 20(d), for example, an interlayer insulating film 30 made from silicon oxide or the like is deposited.

Process 18: As shown in FIGS. 21(a) to 21(d), by polishing and removing the interlayer insulating film 30 up to the middle portion thereof by using a CMP method, a step difference on the surface is eliminated.

Process 19: As shown in FIGS. 22(a) to 22(d), by using an anisotropic etching process with a resist mask (not shown) being used therein, a via-hole 30a is formed so that the surface of the upper electrode 29 is exposed.

Process 20: As shown in FIGS. 23(a) to 23(d), by further carrying out an anisotropic etching process, with a resist mask (not shown) being used, a wiring groove 30b is formed.

Process 21: As shown in FIGS. 24(a) to 24(d), a barrier metal layer 132, for example, made from TaN/Ta, and a wiring layer (bit line) 32, for example, made from copper, are formed so that the wiring groove 30b is filled therewith.

Process 22: As shown in FIGS. 25(a) to 25(d), by using, for example, a CVD method, a passivation film 33, made of silicon nitride and silicon oxide, is formed.

By using the above-mentioned processes, the MRAM 100 in accordance with the present embodiment 1 is completed.

As described above, in the method for manufacturing the MRAM 100 in accordance with embodiment 1, as shown in process 13 (FIGS. 16(a) to 16(d)), since the lower electrode 28 on which the TMR element 50 is mounted is formed by using the CMP method, the surface of the lower electrode 28 becomes very flat. For this reason, the TMR element 50 to be formed on the lower electrode 28, that is, in particular, the film thickness of the tunnel insulating film 53, can be controlled with good precision.

As a result, it becomes possible to provide an MRAM 100 that can reduce irregularities in the readout current between the TMR elements caused by irregularities in the film thickness of the tunnel insulating film 53.

Conventionally, after a metal layer to form the lower electrode 28, the lower magnetic film 51, the tunnel insulating film 53, the upper magnetic film 52 and a metal layer to form the upper electrode 29 have been laminated, first, by simultaneously etching the upper magnetic film 51, the tunnel insulating film 53, the upper magnetic film 52 and the metal layer to form the upper electrode 29, the upper electrode 29 and the TMR element 50 are formed, and lastly, by etching the metal layer using a RIE process or the like, the lower electrode 28 is formed. For this reason, etching residues of the lower electrode 28 or the like adhere to the side walls of the TMR element to cause a short circuit between the lower magnetic film and the upper magnetic film 52. In contrast, in the manufacturing method in accordance with the present embodiment 1, since, after the lower electrode 28 has been formed by the CMP method, the TMR element 50 is manufactured, no etching residues adhere to the side walls of the TMR element 50, making it possible to prevent a short circuit between the lower magnetic film 51 and the upper magnetic film 52, and consequently to improve the production yield.

FIG. 26 is a cross-sectional view showing another memory cell in accordance with the present embodiment 1, the entire portion of which is indicated by reference numeral 180, and in this structure, the present invention is applied to an STT (Spin Torque Transfer)-RAM. In FIG. 26, the same reference numerals as those in FIGS. 2(a) and 2(b) represent the same or corresponding portions.

As shown in FIG. 26, in the memory cell 180 of STT-RAM, the TMR element 50 is formed right above the wiring layer 25.

In the memory cell 180, since the lower electrode 28 is formed through the CMP method, by using a damascene technique, the surface of the lower electrode 28 becomes very flat. The lower electrode 28 is made from W, Cu, Ta or the like. As a result, it becomes possible to minimize irregularities in the magnetic characteristics between the respective memory cells 180, and consequently to provide an STT-RAM with high performances. In the STT-RAM in which the TMR element is formed right above the lower electrode 28, the flatness of the tunnel insulating film is particularly important; therefore, the present embodiment, which can improve the flatness of the lower electrode 28 and the tunnel insulating film 53, is particularly effective for the STT-RAM.

Conventionally, upon processing the lower electrode (leading line) 28, depositions are accumulated on a side wall of the TMR film, however, in the present embodiment, since the lower electrode 28 is formed prior to processing the TMR film, it is possible to prevent depositions from accumulating on the side wall of the TMR film, and consequently to prevent a leakage between the upper magnetic film (free layer) 52 and the lower magnetic film (pin layer) 51.

Embodiment 2

FIGS. 27(a) and 27(b) are enlarged views each showing a memory cell 150 (see FIG. 1(a)) of an MRAM in accordance with embodiment 2, the entire portion of which is indicated by reference numeral 200, and FIG. 27(a) is a top view, and FIG. 27(b) is a cross-sectional view showing a portion near a TMR element. Moreover, FIGS. 28(a) to 28(c) are cross-sectional views of the MRAM 200, and FIG. 28(a) is a cross-sectional view taken along the A-A direction in FIG. 27(a), FIG. 28(b) is a cross-sectional view taken along the B-B direction in FIG. 27(a), and FIG. 28(c) is a cross-sectional view taken along the C-C direction in FIG. 27(a). In FIGS. 27(a) to 28(c), the same reference numerals as those in FIGS. 42(a) and 42(b) indicate the same or corresponding portions.

In the MRAM 200 in accordance with the present embodiment 2, the structure lower than the third wiring layer (digit line 24) 25 is the same as that of the MRAM 100 described above.

As clearly shown in FIG. 27(b), in the MRAM 200 of embodiment 2, an interlayer insulating film 65, for example, made from silicon nitride, and an interlayer insulating film 66, for example, made from silicon oxide, are laminated on the third wiring layer (digit line 24) 25 and the interlayer insulating film 23, and a barrier metal layer 160, for example, made from TaN/Ta, and a wiring layer (contact plug) 60, for example, made from copper, are embedded in openings formed in these layers.

Moreover, an interlayer insulating film 67, for example, made from silicon nitride, and an interlayer insulating film 68, for example, made from silicon oxide, are laminated on the wiring layer (contact plug) 60, and a barrier metal layer 128, for example, made from TiN/Ti, and a lower electrode 28, for example, made from tungsten, are formed in openings formed in these layers.

A TMR element 50 and the like are formed on the lower electrode 28, of which structures are the same as those of the aforementioned MRAM 100.

Next, referring to FIGS. 29(a) to 33(d), the following description will discuss a method for manufacturing the MRAM 200 in accordance with embodiment 2. Among FIGS. 29(a) to 33(d), FIGS. 29(a) to 29(c) through FIGS. 33(a) to 33(c) are cross-sectional views respectively taken along the A-A direction, the B-B direction and the C-C direction in FIG. 27(a). In FIGS. 29(a) to 33(d), the same reference numerals as those in FIGS. 42(a) and 42(b) indicate the same or corresponding portions.

The method for manufacturing the MRAM 200 of the present embodiment 2 includes the following processes 10 to 22, and the processes prior to these are the same as those processes shown in the aforementioned embodiment 1. That is, the following processes are carried out in succession to the processes 1 to 9 (FIGS. 4(a) to 12(d)) explained in embodiment 1.

Process 10: As shown in FIGS. 29(a) to 29(d), an interlayer insulating film 65, made from silicon nitride or the like, and an interlayer insulating film 66, made from silicon oxide or the like, are successively deposited so as to cover the wiring layers 24, 25 and the interlayer insulating film 23. Successively, this is subjected to an anisotropic etching process by using a resist mask so that an opening is formed so as to expose the surface of the wiring layer 25.

Next, a barrier metal layer 160, for example, made from TaN/Ta, and a wiring layer (contact plug) 60, for example, made from copper are formed by using, for example, a CMP method so as to bury the openings.

Process 11: As shown in FIGS. 30(a) to 30(d), an interlayer insulating film 67, for example, made from silicon nitride, and an interlayer insulating film 68, for example, made from silicon oxide, are successively accumulated thereon.

Process 12: As shown in FIGS. 31(a) to 31(d), by using an anisotropic etching process using a resist mask, an opening 68a is formed in the interlayer insulating films 67 and 68 so that the surface of the wiring layer 60 is exposed.

Process 13: As shown in FIGS. 32(a) to 32(d), after forming a barrier metal layer 128 made from TiN/Ti or the like, so as to bury the opening 68a, a metal layer 228, for example, made of tungsten, is formed on the entire surface by using a CVD method or the like.

Process 14: As shown in FIGS. 33(a) to 33(d), by using a damascene technique by the use of a CMP method, the metal layer 228 is polished and removed from the upper portion thereof so that the metal layer 228 is left so as to be embedded into the opening portion 68a. In the CMP process for the metal layer 228, for example, a silica-based slurry is used, and after the CMP process, an RCE rinsing process is carried out. Thus, the remaining metal layer 228 is allowed to form a lower electrode (leading wire) 28.

The succeeding processes are carried out in the same manner as in steps 14 to 19 (FIGS. 17(a) to 22(d)) of the aforementioned embodiment 1. The MRAM 200 in accordance with the present embodiment 2 is completed by the above-mentioned processes.

As described above, in the method for manufacturing the MRAM 200 of the present embodiment 2, as shown in process 14 (FIGS. 33(a) to 33(d)), since the lower electrode 28 on which the TMR element 50 is mounted is formed by using the CMP method, the surface of the lower electrode 28 becomes very flat. For this reason, the TMR element 50 to be formed on the lower electrode 28, that is, in particular, the film thickness of the tunnel insulating film 53, can be controlled with good precision.

As a result, it becomes possible to provide an MRAM 200 that can reduce irregularities in the readout current between the TMR elements caused by irregularities in the film thickness of the tunnel insulating film 53.

Moreover, since the TMR element 50 is formed after the lower electrode has been formed by the CMP method, no etching residues adhere to the side walls of the TMR element 50, making it possible to prevent a short circuit between the lower magnetic film 51 and the upper magnetic film 52, and consequently to improve the production yield.

In particular, since, in the MRAM 200, the wiring layer (contact plug) 60 beneath the lower electrode 28 is formed by using copper that is different from the material (tungsten) of the lower electrode 28, it becomes possible to reduce the electrical resistance of the wiring layer (contact plug) 60.

FIG. 34 is a cross-sectional view showing another memory cell in accordance with the present embodiment 1, the entire portion of which is indicated by reference numeral 280, and in this structure, the present invention is applied to an STT (Spin Torque Transfer)-RAM. In FIG. 34, the same reference numerals as those in FIGS. 27(a) and 27(b) represent the same or corresponding portions.

As shown in FIG. 34, in the memory cell 280 of STT-RAM, the TMR element 50 is formed right above the wiring layer 25.

In the memory cell 280, since the lower electrode 28 is formed through the CMP method, by using a damascene technique, the surface of the lower electrode 28 becomes very flat. More specifically, the wiring layer 25 and the lower electrode 28 are formed by using different materials by using a single damascene technique. For example, the wiring layer 25 and the lower electrode 28 are made from W, Cu, Ta or the like. As a result, it becomes possible to minimize irregularities in the magnetic characteristics between the respective memory cells 280, and consequently to provide an STT-RAM with high performances. In the STT-RAM in which the TMR element is formed right above the lower electrode 28, the flatness of the tunnel insulating film is particularly important; therefore, the present embodiment, which can improve the flatness of the lower electrode 28 and the tunnel insulating film 53, is particularly effective for the STT-RAM.

Conventionally, upon processing the lower electrode (leading line) 28, depositions are accumulated on a side wall of the TMR film, however, in the present embodiment, since the lower electrode 28 is formed prior to processing the TMR film, it is possible to prevent depositions from accumulating on the side wall of the TMR film, and consequently to prevent a leakage between the upper magnetic film (free layer) 52 and the lower magnetic film (pin layer) 51.

Embodiment 3

FIGS. 35(a) and 35(b) are enlarged views each showing a memory cell 150 (see FIG. 1(a)) of an MRAM in accordance with embodiment 3, the entire portion of which is indicated by reference numeral 300, and FIG. 35(a) is a top view, and FIG. 35(b) is a cross-sectional view showing a portion near a TMR element. Moreover, FIGS. 36(a) to 36(c) are cross-sectional views of the MRAM 300, and FIG. 36(a) is a cross-sectional view taken along the A-A direction in FIG. 35(a), FIG. 36(b) is a cross-sectional view taken along the B-B direction in FIG. 35(a), and FIG. 36(c) is a cross-sectional view taken along the C-C direction in FIG. 35(a). In FIGS. 33(a) to 34, the same reference numerals as those in FIGS. 42(a) and 42(b) indicate the same or corresponding portions.

In an MRAM 300 in accordance with the present embodiment 3, the structure that is lower than the third wiring layer (digit line) 25 is the same as that of the MRAM 100.

As clearly shown in FIG. 35(b), in the MRAM 300 of embodiment 2, an interlayer insulating film 26, for example, made from silicon nitride, and an interlayer insulating film 27, for example, made from silicon oxide, are laminated on the third wiring layer (digit line 24) 25 and the interlayer insulating film 23. Moreover, via-holes are formed in the interlayer insulating films 26 and 27, and a barrier metal layer 128 and a lower electrode 28 are formed so as to be embedded therein. Since the lower electrode (leading line) 28 is made from tantalum or the like, by using a CMP method, it has very flat surface (which will be described later in detail in the description of the manufacturing method).

A convex portion with an upper flat portion is formed at a position where the TMR element 50 is formed on the lower electrode 28, and the TMR element 50 is disposed on this portion. The convex portion and the TMR element 50 have substantially the same continuous cross section. That is, the side face of the convex portion and the side face of the TMR element 50 are substantially aligned with each other. Moreover, the surface of the interlayer insulating film 27 and the surface of the lower electrode 28 embedded in the interlayer insulating film 27 are allowed to form substantially the same plane.

The structure above the TMR element 50 is the same as that of the aforementioned MRAM 100.

Next, referring to FIGS. 37(a) to 39(d), the following description will discuss a method for manufacturing the MRAM 300 in accordance with embodiment 3. Among FIGS. 37(a) to 39(d), FIGS. 37(a) to 37(c) through FIGS. 39(a) to 39(c) are cross-sectional views respectively taken along the A-A direction, the B-B direction and the C-C direction in FIG. 27 (a), and FIGS. 37(d), 38(d), and 39(d) are cross-sectional views each showing a peripheral circuit portion. In FIGS. 37(a) to 39(d), the same reference numerals as those in FIGS. 42(a) and 42(b) indicate the same or corresponding portions.

The method for manufacturing the MRAM 300 of the present embodiment 3 includes the following processes 13 to 15, and the processes prior to these are the same as those processes shown in the aforementioned embodiment 1. That is, the following processes are carried out in succession to the processes 1 to 12 (FIGS. 4(a) to 15(d)) explained in embodiment 1.

Process 13: As shown in FIGS. 37(a) to 37(d), a metal layer 228 is polished from above by using a damascene technique using the CMP method. For example, a silica-based slurry is used for the CMP for the metal layer 228, and a washing process is carried out after the CMP process. Upon finishing the process 13, the metal layer 228 remains not only in the opening portion of the interlayer insulating film 27, but also on the surface thereof.

Process 14: As shown in FIGS. 38(a) to 38(d), a lower magnetic film 51, a tunnel insulating film 53 and an upper magnetic film, which constitute the TMR element, are successively deposited on the metal layer 228 by using a sputtering method or the like. The lower magnetic film 51 and the upper magnetic film 52 are made of, for example, ferromagnetic films, such as permalloy-based metal, and the tunnel insulating film 53 is made of, for example, alumina and MgO.

Moreover, a metal layer 229 made from tungsten or the like, is deposited on the upper magnetic film 52.

Process 15: As shown in FIGS. 39(a) to 39(d), the lower magnetic film 51, the tunnel insulating film 53, the upper magnetic film 52 and the metal layer 229 are patterned by etching, such as an RIE method using a resist mask (not shown) so that a TMR element configured by the lower magnetic film 51, the tunnel insulating film 53 and the upper magnetic film 52, and the upper electrode 29 are formed. These etching processes are carried out until the metal layer 228 on the interlayer insulating film 27 has been removed so that the surface of the interlayer insulating film 27 is exposed. As a result, the surface of the interlayer insulating film 27 and the surface of the lower electrode 28 embedded in the interlayer insulating film 27 are allowed to form substantially the same plane. Moreover, a convex portion with an upper flat portion, made of one portion of the lower electrode 28 with substantially the same cross section as that of the TMR element 50, is formed on the lower portion of the TMR element 50. This convex portion is formed on the lower portion of the TMR element 50 in a self-aligned manner. That is, the side face of the convex portion and the side face of the TMR element 50 are aligned with each other within a range of irregularities derived from etching processes by the use of the same mask.

The succeeding processes are carried out in the same manner as in steps 16 to 19 (FIGS. 19(a) to 22(d)) of the aforementioned embodiment 1. The MRAM 300 in accordance with the present embodiment 3 is completed by the above-mentioned processes.

As described above, in the method for manufacturing the MRAM 300 of the present embodiment 3, as shown in process 13 (FIGS. 37(a) to 37(d)), since the lower electrode 28 on which the TMR element 50 is mounted is formed by using the CMP method, the surface of the lower electrode 28 becomes very flat. For this reason, the TMR element 50 to be formed on the lower electrode 28, that is, in particular, the film thickness of the tunnel insulating film 53, can be controlled with good precision.

As a result, it becomes possible to provide an MRAM 300 that can reduce irregularities in the readout current between the TMR elements 50 caused by irregularities in the film thickness of the tunnel insulating film 53.

Moreover, since the TMR element 50 is formed after the lower electrode has been formed by the CMP method, no etching residues adhere to the side walls of the TMR element 50, making it possible to prevent a short circuit between the lower magnetic film 51 and the upper magnetic film 52, and consequently to improve the production yield.

Moreover, in the MRAM 300 of the present embodiment 3, since the convex portion made of one portion of the lower electrode 28 is formed on the lower portion of the TMR element 50 in a self-aligned manner. For this reason, the TMR element 50 is always mounted on the lower electrode 28 with a flat top face so that it becomes possible to prevent irregularities in the readout current between the TMR elements 50 caused by irregularities in the film thickness of the tunnel insulating film 53.

FIGS. 40(a) to 40(d) are cross-sectional views showing effects obtained in a case where the MRAM 300 is particularly reduced in size as well as is integrated.

FIG. 40(a) is a cross-sectional view showing the MRAM 300, and FIG. 40(b) is a cross-sectional view that shows the MRAM 300 that is miniaturized (integrated) in the lateral direction. Moreover, FIG. 40(d) is a cross-sectional view showing an MRAM 500 having a conventional structure.

In the conventional MRAM 500 shown in FIG. 40(d), a margin L2 needs to be prepared so that the TMR element 50 is mounted on the lower electrode 28, even in the case of the miniaturized structure, causing a limitation to the miniaturization (integration).

In contrast, in the MRAM 300, since the lower electrode 28 is always formed on the lower portion of the TMR element 50, no margin L2 needs to be prepared, which makes this structure different from the conventional structure.

Moreover, in the MRAM having the conventional structure, the surface of the lower electrode 28 is not flat in close proximity of the region connected with the wiring layer 25. Therefore, it is necessary to provide the margin L1 upon forming the TMR element 50.

In contrast, in the MRAM 300, since the lower electrode 28 is always formed on the lower portion of the TMR element 50, it is not necessary to take the margin L1 into consideration, as was found to be the case in the conventional structure.

On the other hand, FIG. 40(c) is a cross-sectional view of an MRAM in which the lower electrode 28 is formed by using the CMP method. As shown in this cross-sectional view, the lower electrode 28 tends to have a dent in the center portion due to erosion by the CMP process. For this reason, in the case when the TMR element 50 is formed at a position as shown in FIG. 40(c), the TMR element 50 is located on a step difference. The resulting problem is that there are irregularities in the film thickness of the tunnel insulating film 53 and the subsequent irregularities in the readout current between the TMR elements 50. For this reason, in order to form the TMR element 50 on a flat region of the lower electrode 28, the margin L1 needs to be prepared, causing a limitation to the miniaturization (integration).

As described above, in the MRAM 300 in accordance with the present embodiment 3, since the TMR element 50 is formed on the lower electrode 28 having a convex shape with a flat top face in a self-aligned manner, it is not necessary to install a margin, as was found to be the case in the conventional structure, making it possible to miniaturize and integrate the MRAM 300.

FIG. 41 is a cross-sectional view showing another memory cell in accordance with the present embodiment, the entire portion of which is indicated by reference numeral 380, and in this structure, the present invention is applied to an STT (Spin Torque Transfer)-RAM. In FIG. 41, the same reference numerals as those in FIGS. 35(a) and 35(b) represent the same or corresponding portions.

As shown in FIG. 41, in the memory cell 380 of STT-RAM, the TMR element 50 is formed right above the wiring layer 25.

In the memory cell 380, upon forming the lower electrode (leading line) 28, the CMP process (with a stop in the middle of the process) is carried out so as to flatten its surface, and upon processing the TMR film, the lower electrode 28 is also simultaneously processed. For this reason, the surface of the lower electrode 28 becomes very flat. The lower electrode 28 is made from W, Cu, Ta, or the like. As a result, it becomes possible to minimize irregularities in the magnetic characteristics between the respective memory cells 380, and consequently to provide an STT-RAM with high performances. In the STT-RAM in which the TMR element is formed right above the lower electrode 28, the flatness of the tunnel insulating film is particularly important; therefore, the present embodiment, which can improve the flatness of the lower electrode 28 and the tunnel insulating film 53, is particularly effective for the STT-RAM.

Moreover, since the CMP process of the lower electrode 28 is stopped in the middle of the process, it is possible to prevent the occurrence of dishing. Moreover, since the TMR film and the lower electrode 28 are simultaneously processed, the values of L1 and L2, shown in FIGS. 40(*a*) to 40(*d*), can be reduced so that it becomes possible to miniaturize the cell size.

DESCRIPTION OF REFERENCE NUMERALS

Figure 1:
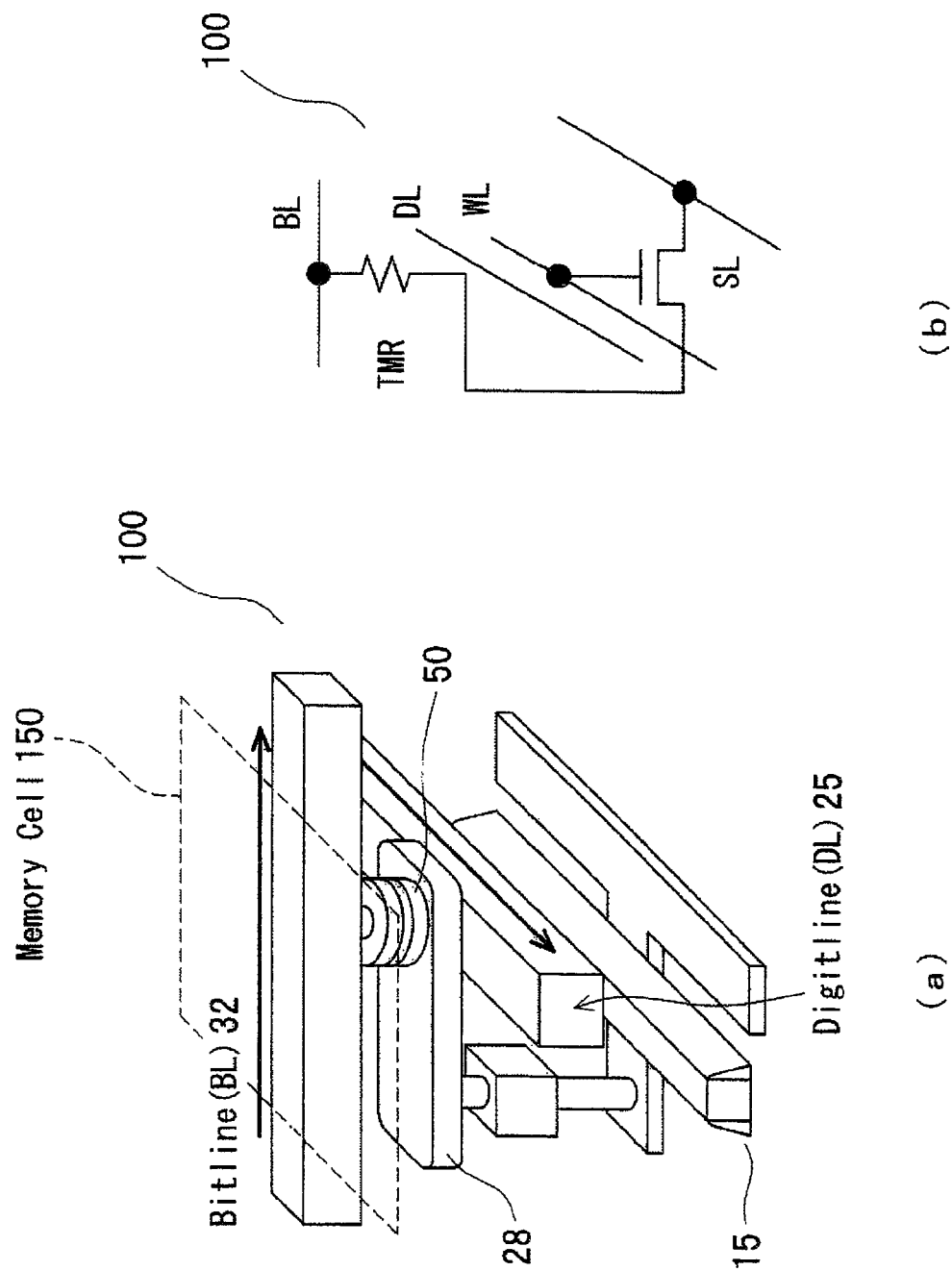
FIGS. 1(*a*) and 1(*b*) each are a schematic view and a circuit diagram of an MRAM in accordance with embodiment 1 of the present invention.
Figure 2:
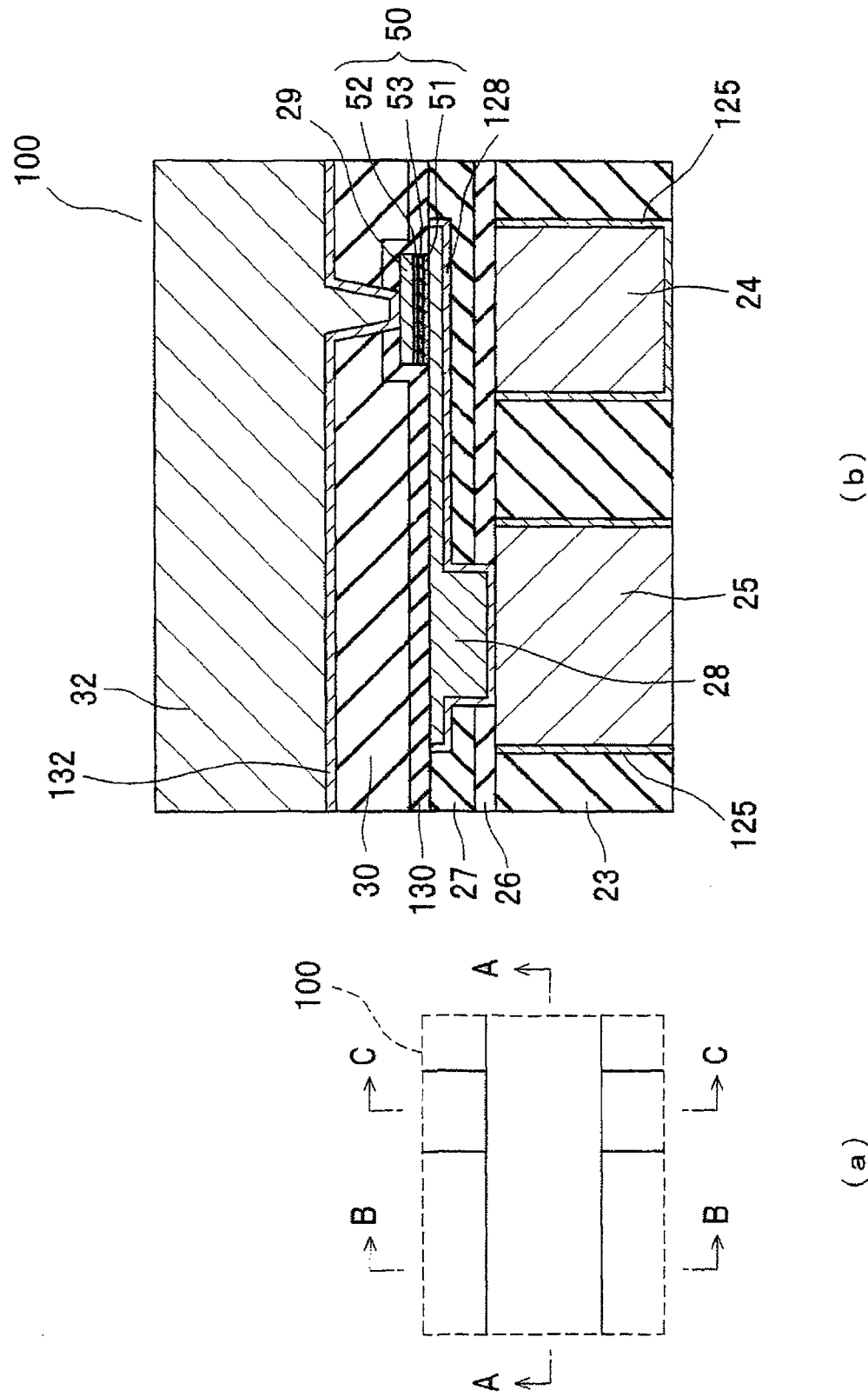
FIGS. 2(*a*) and 2(*b*) are enlarged views that each show a memory cell of the MRAM in accordance with embodiment 1 of the present invention.
Figure 3:
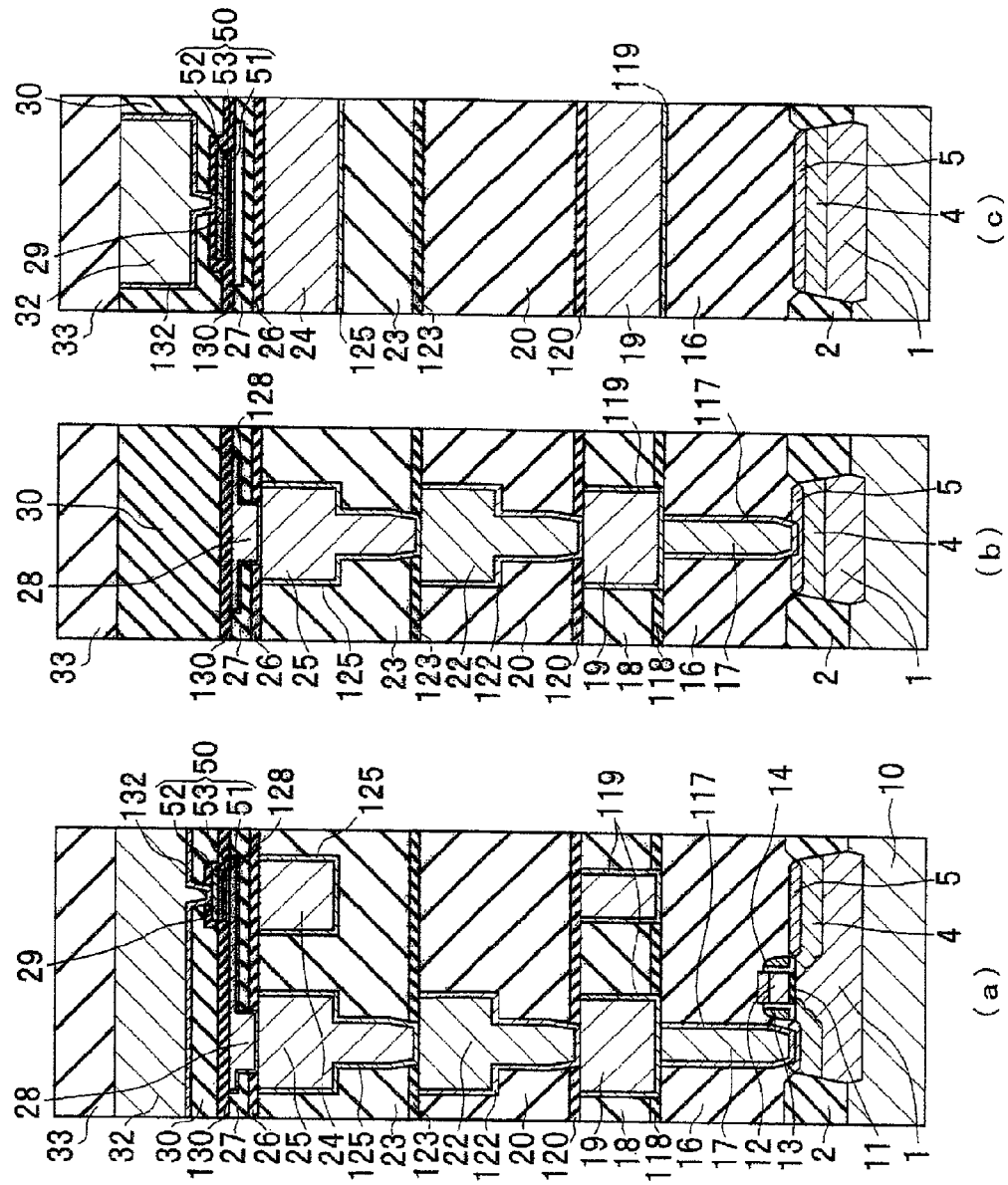
FIGS. 3(*a*) to 3(*c*) are cross-sectional views of the MRAM in accordance with embodiment 1 of the present invention.
Figure 4:
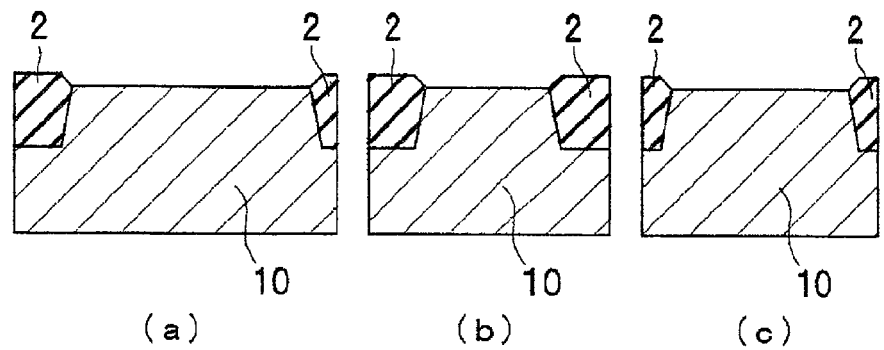
FIGS. 4(*a*) to 4(*c*) are cross-sectional views each showing a manufacturing process of the MRAM in accordance with embodiment 1 of the present invention.
Figure 5:
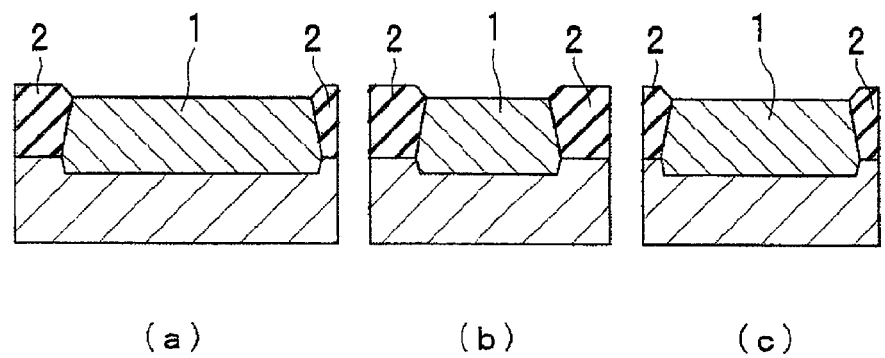
FIGS. 5(*a*) to 5(*c*) are cross-sectional views each showing a manufacturing process of the MRAM in accordance with embodiment 1 of the present invention.
Figure 6:
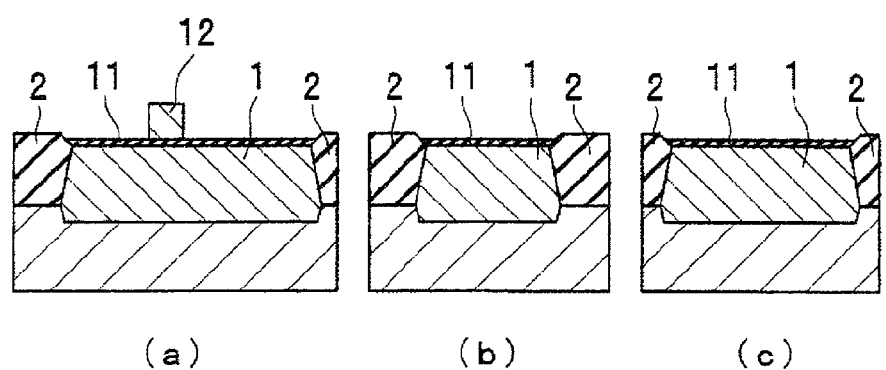
FIGS. 6(*a*) to 6(*c*) are cross-sectional views each showing a manufacturing process of the MRAM in accordance with embodiment 1 of the present invention.
Figure 7:
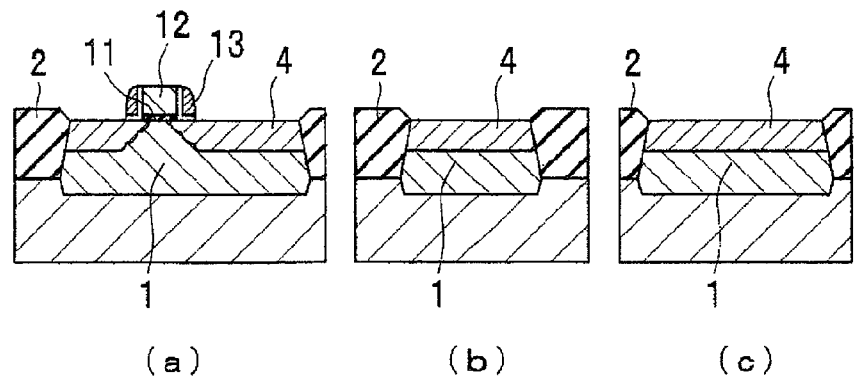
FIGS. 7(*a*) to 7(*c*) are cross-sectional views each showing a manufacturing process of the MRAM in accordance with embodiment 1 of the present invention.
Figure 8:
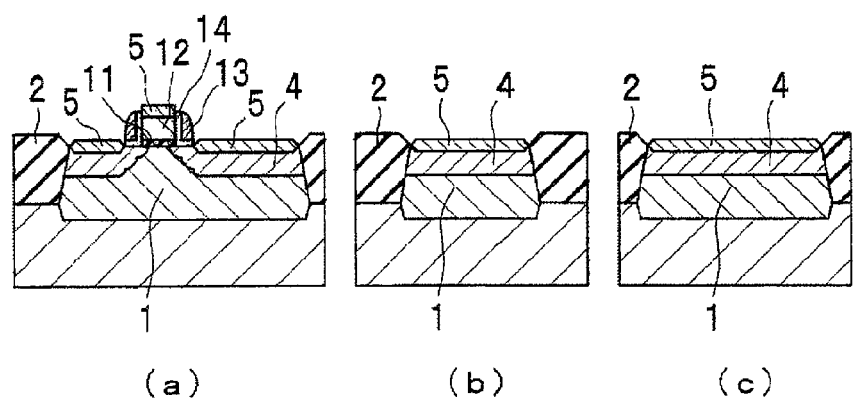
FIGS. 8(*a*) to 8(*c*) are cross-sectional views each showing a manufacturing process of the MRAM in accordance with embodiment 1 of the present invention.
Figure 9:
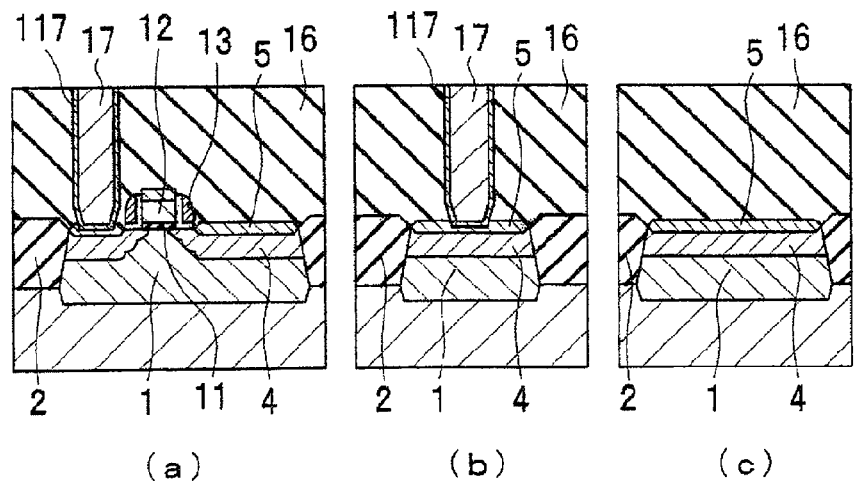
FIGS. 9(*a*) to 9(*c*) are cross-sectional views each showing a manufacturing process of the MRAM in accordance with embodiment 1 of the present invention.
Figure 10:
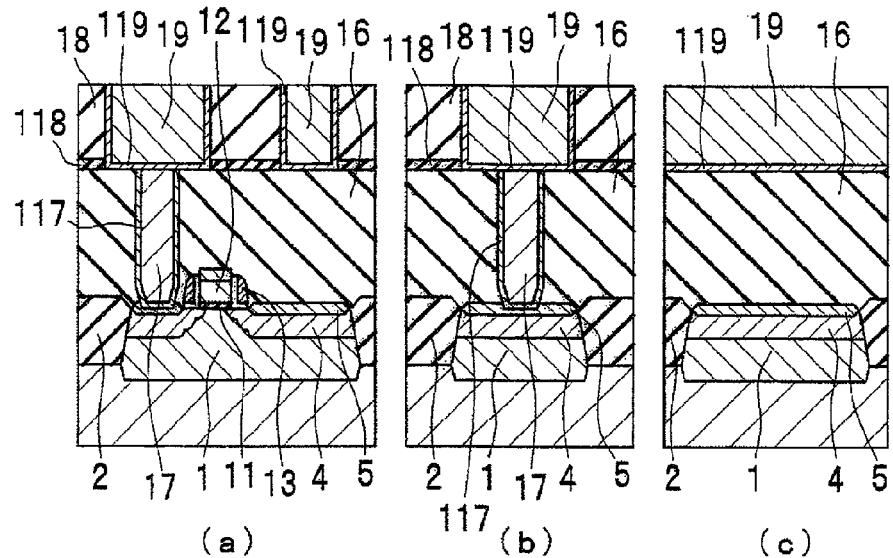
FIGS. 10(*a*) to 10(*c*) are cross-sectional views each showing a manufacturing process of the MRAM in accordance with embodiment 1 of the present invention.
Figure 11:
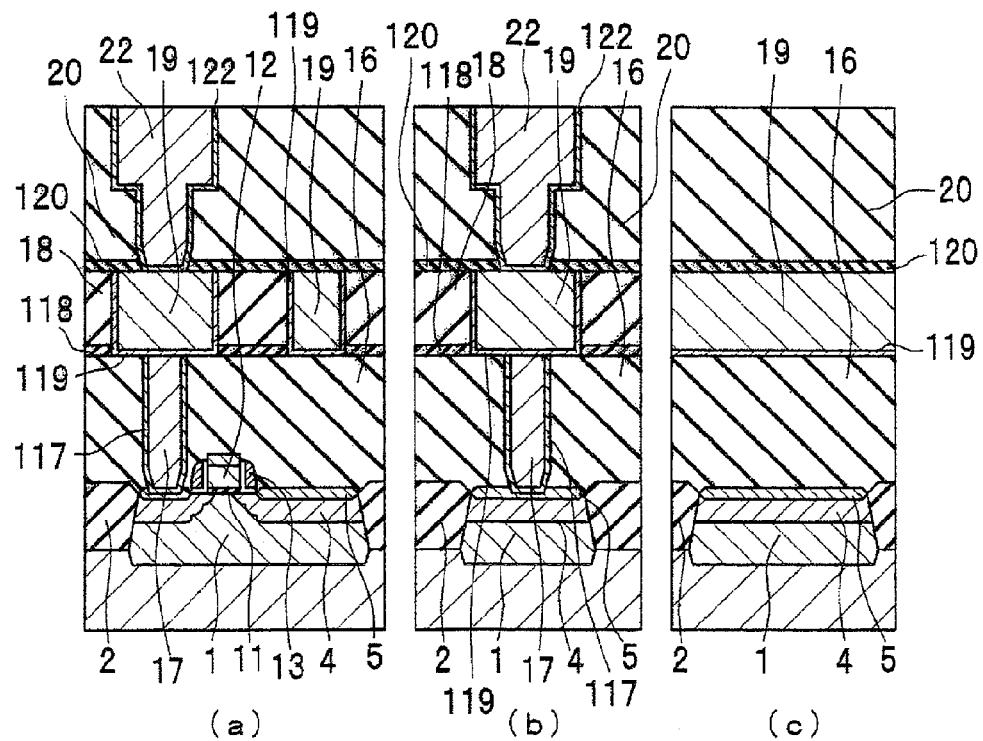
FIGS. 11(*a*) to 11(*c*) are cross-sectional views each showing a manufacturing process of the MRAM in accordance with embodiment 1 of the present invention.
Figure 12:
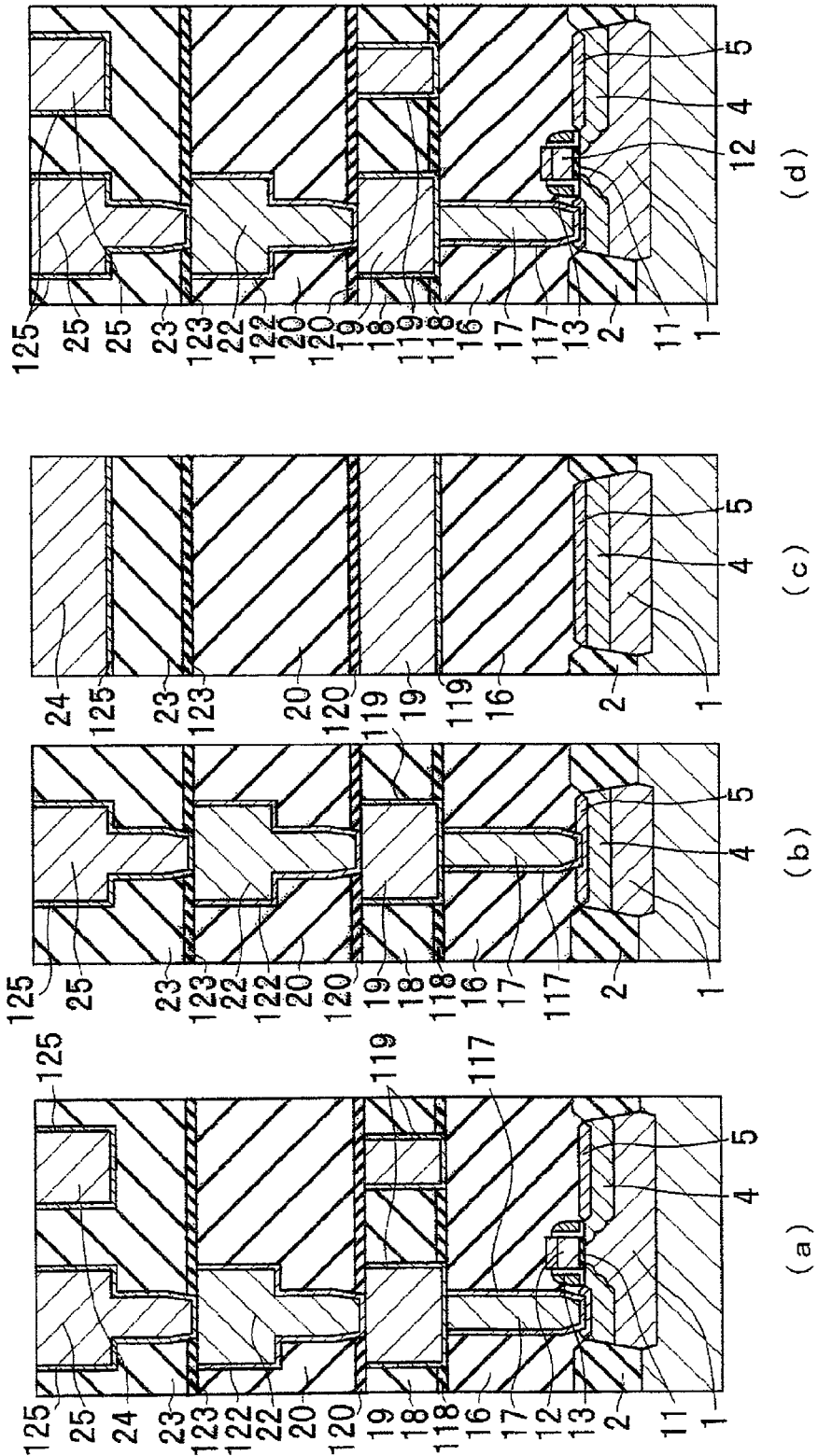
FIGS. 12(*a*) to 12(*d*) are cross-sectional views each showing a manufacturing process of the MRAM in accordance with embodiment 1 of the present invention.
Figure 13:
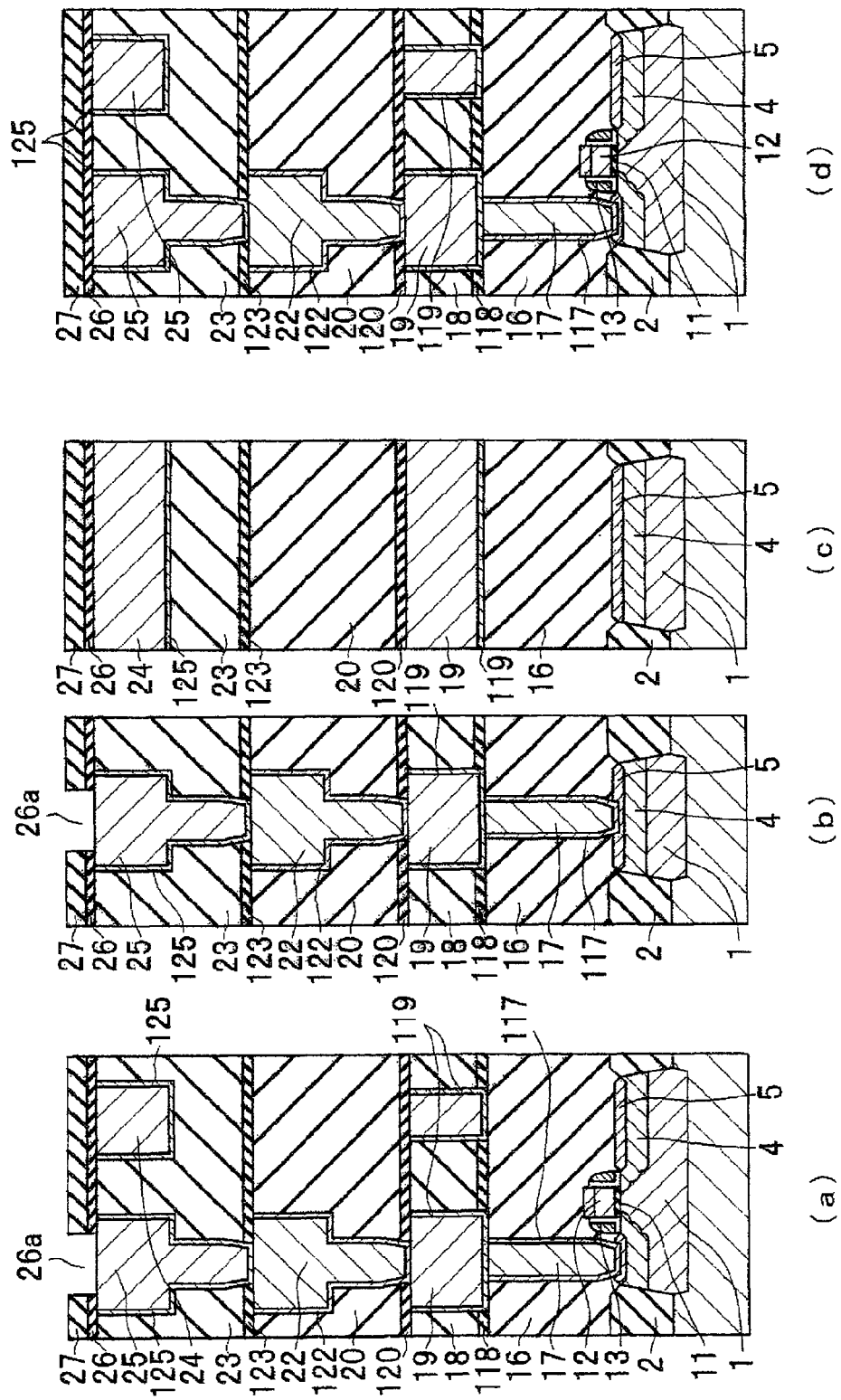
FIGS. 13(*a*) to 13(*d*) are cross-sectional views each showing a manufacturing process of the MRAM in accordance with embodiment 1 of the present invention.
Figure 14:
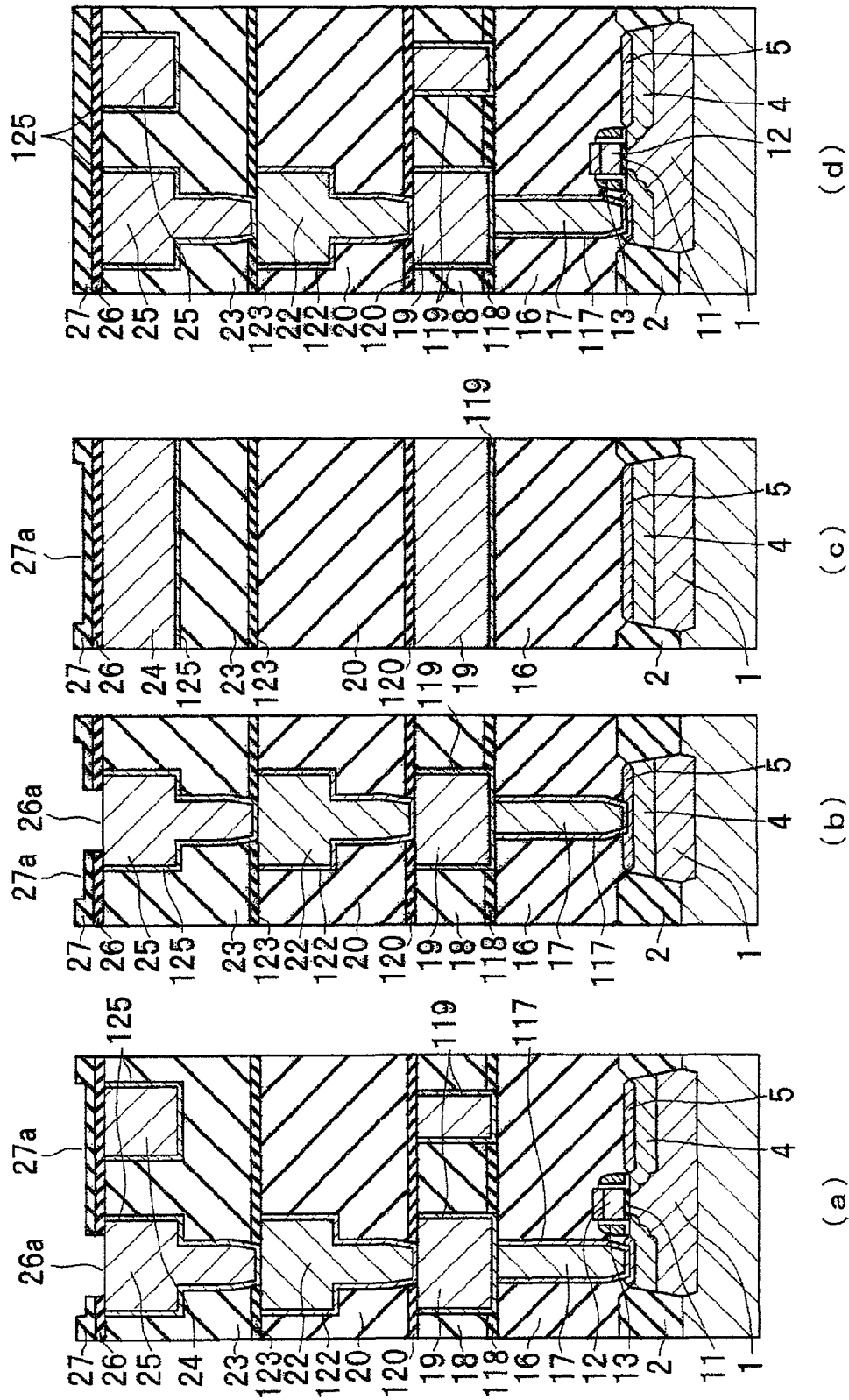
FIGS. 14(*a*) to 14(*d*) are cross-sectional views each showing a manufacturing process of the MRAM in accordance with embodiment 1 of the present invention.
Figure 15:
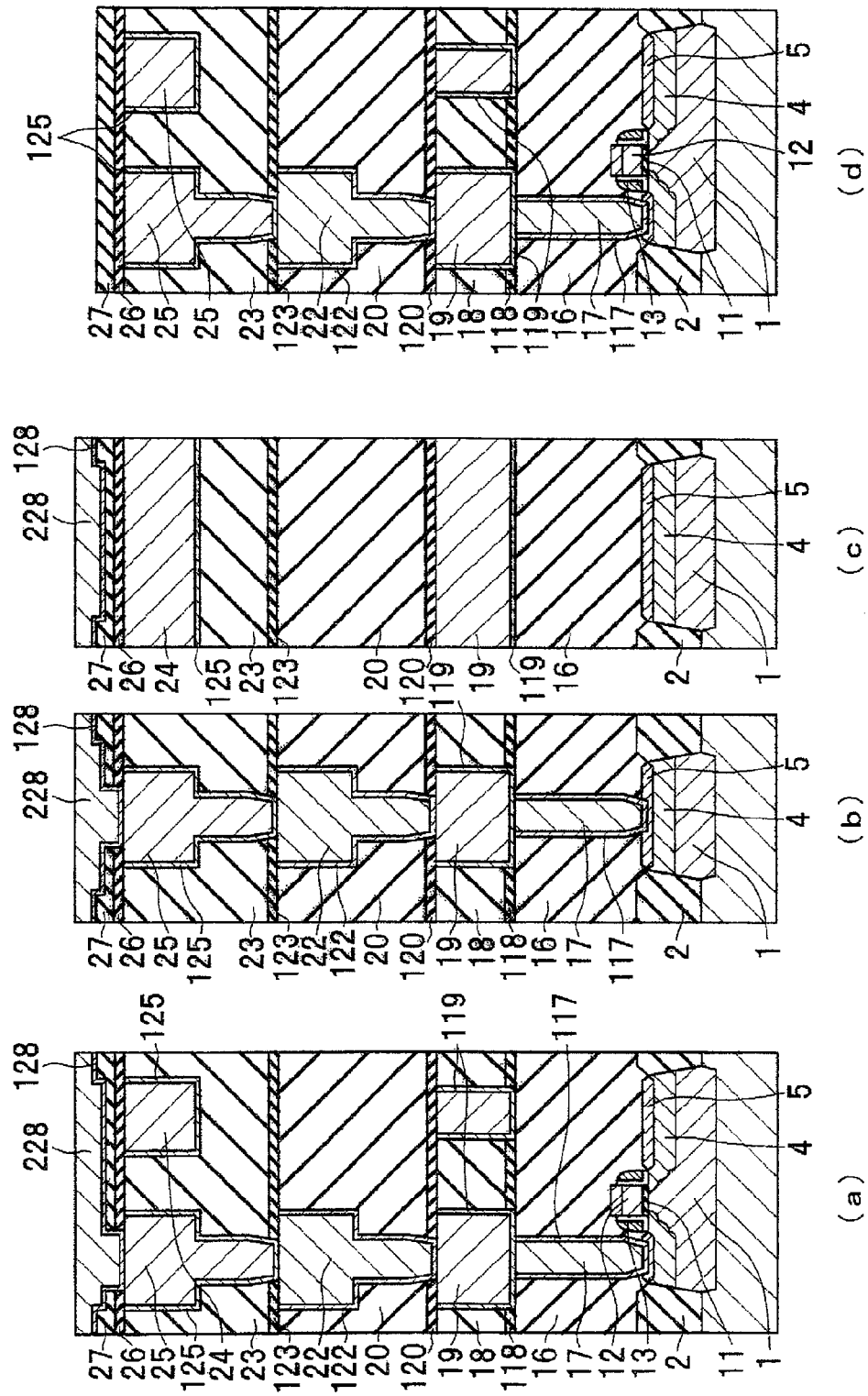
FIGS. 15(*a*) to 15(*d*) are cross-sectional views each showing a manufacturing process of the MRAM in accordance with embodiment 1 of the present invention.
Figure 16:
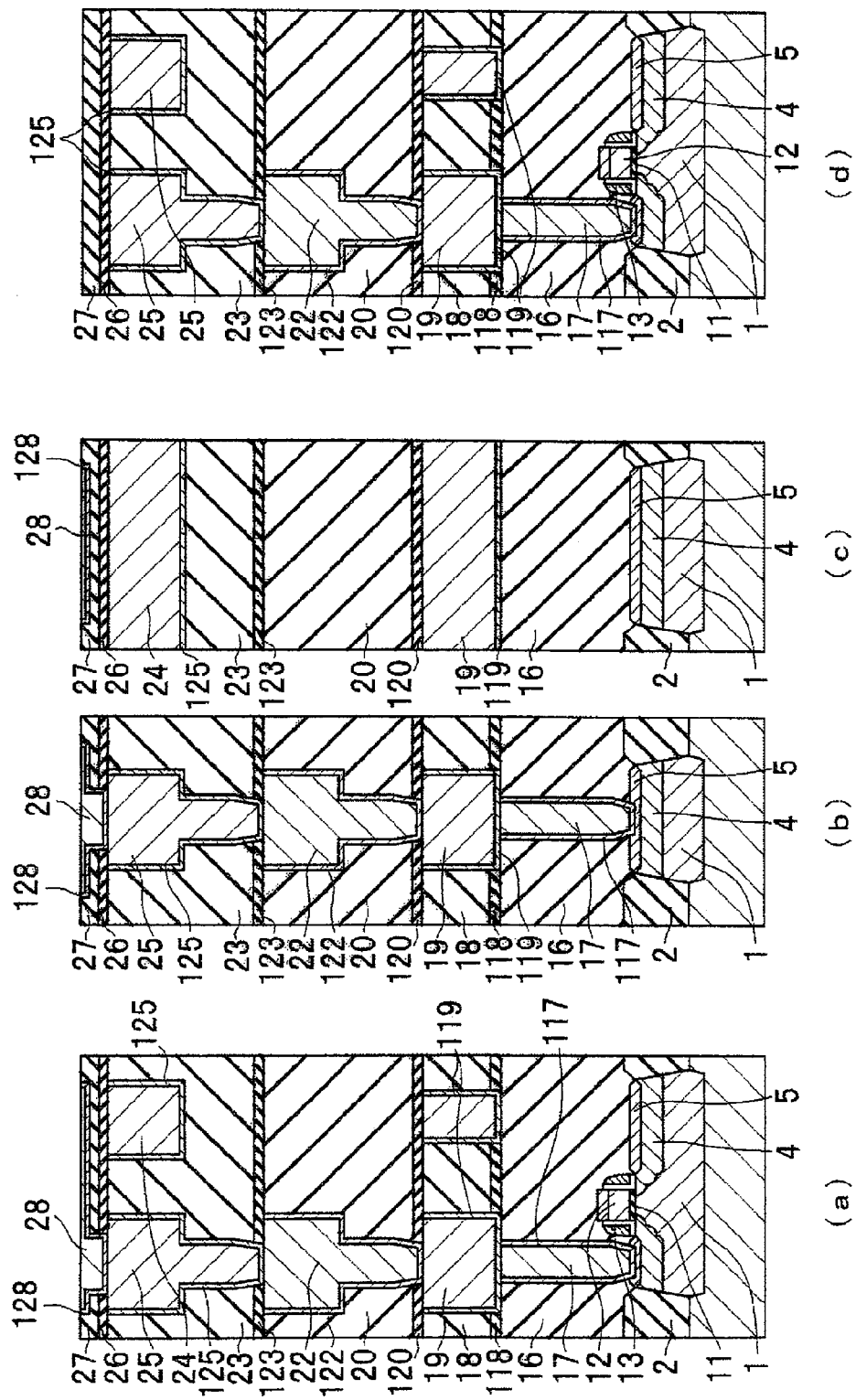
FIGS. 16(*a*) to 16(*d*) are cross-sectional views each showing a manufacturing process of the MRAM in accordance with embodiment 1 of the present invention.
Figure 17:
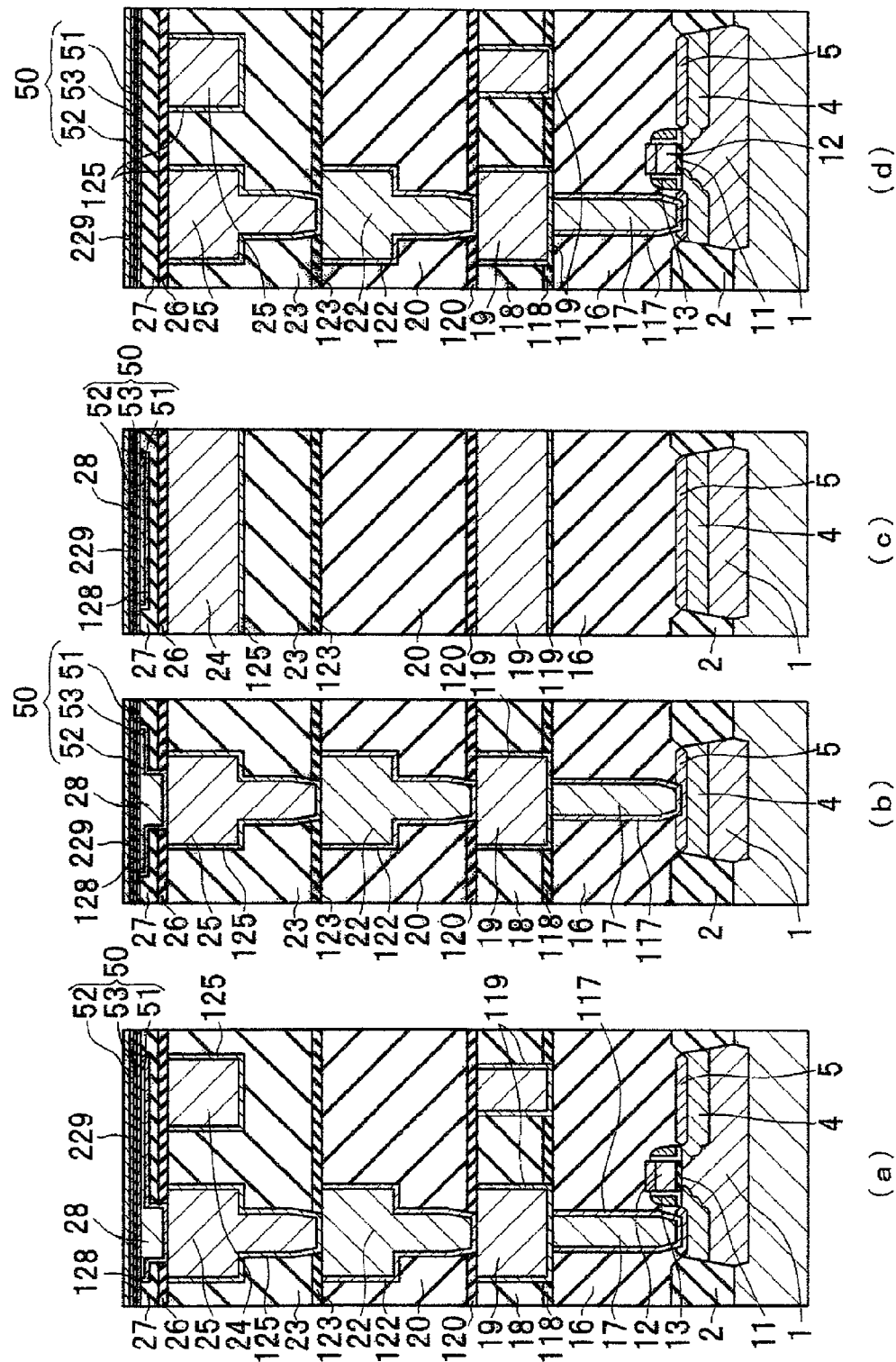
FIGS. 17(*a*) to 17(*d*) are cross-sectional views each showing a manufacturing process of the MRAM in accordance with embodiment 1 of the present invention.
Figure 18:
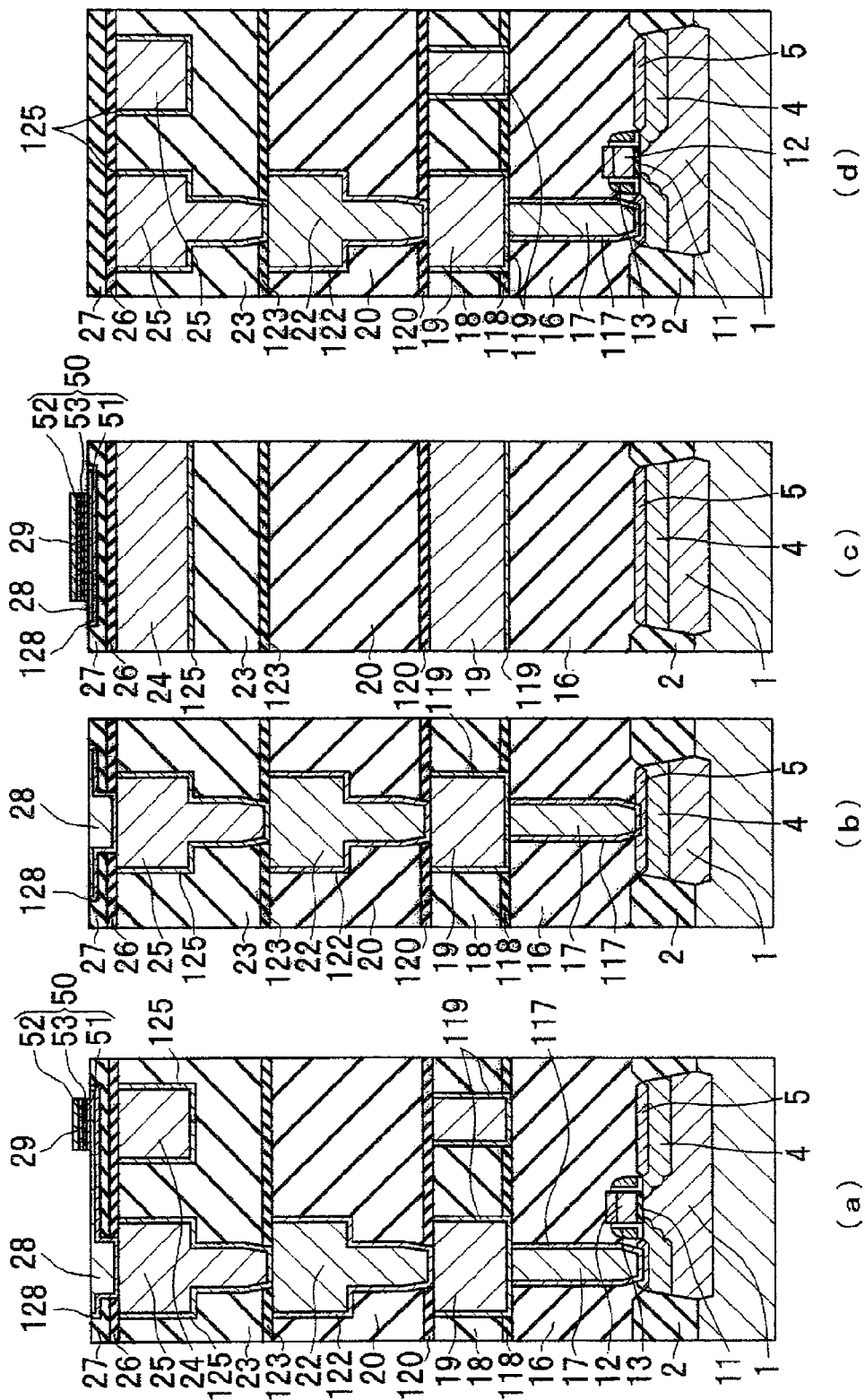
FIGS. 18(*a*) to 18(*d*) are cross-sectional views each showing a manufacturing process of the MRAM in accordance with embodiment 1 of the present invention.
Figure 19:
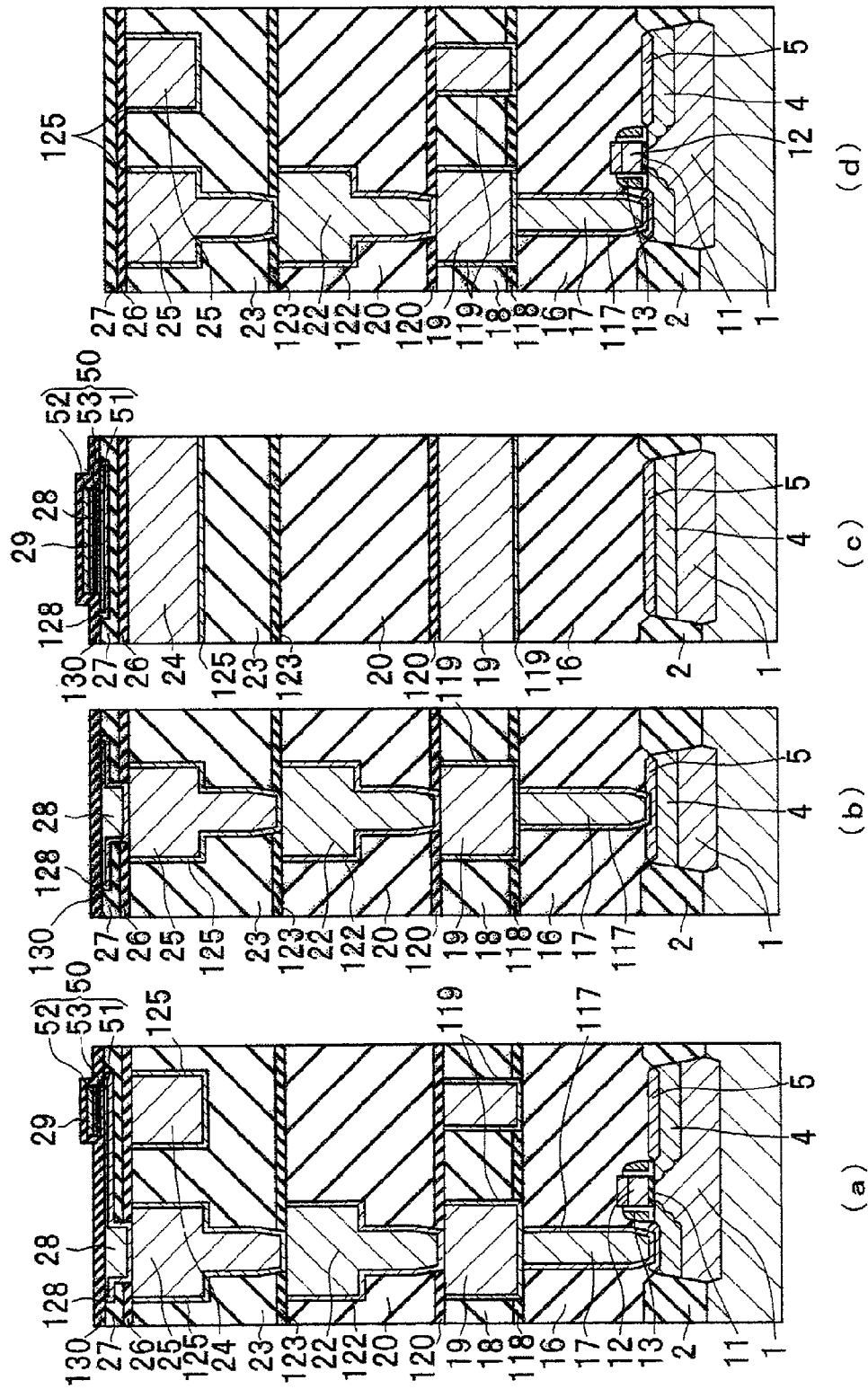
FIGS. 19(*a*) to 19(*d*) are cross-sectional views each showing a manufacturing process of the MRAM in accordance with embodiment 1 of the present invention.
Figure 20:
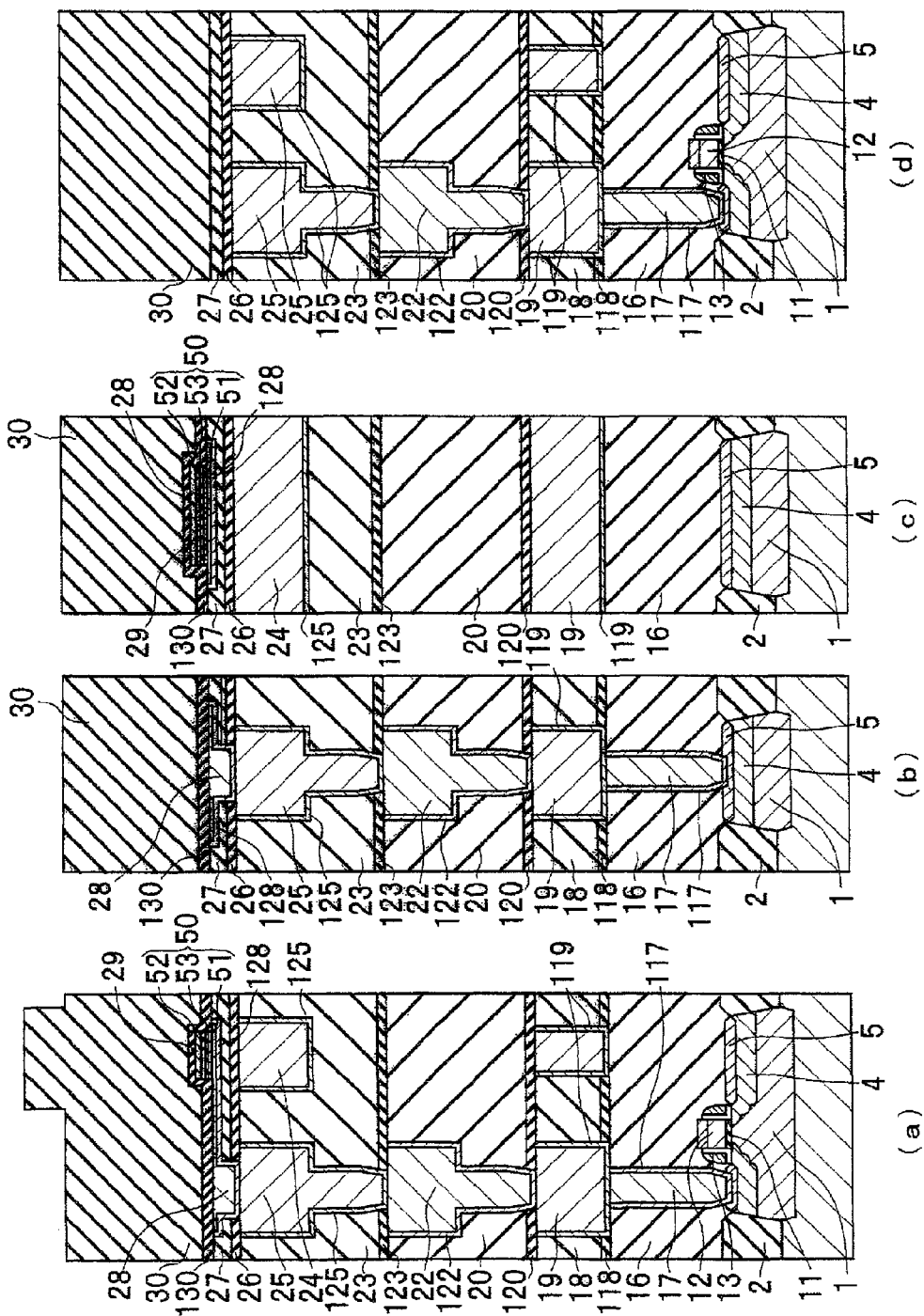
FIGS. 20(*a*) to 20(*d*) are cross-sectional views each showing a manufacturing process of the MRAM in accordance with embodiment 1 of the present invention.
Figure 21:
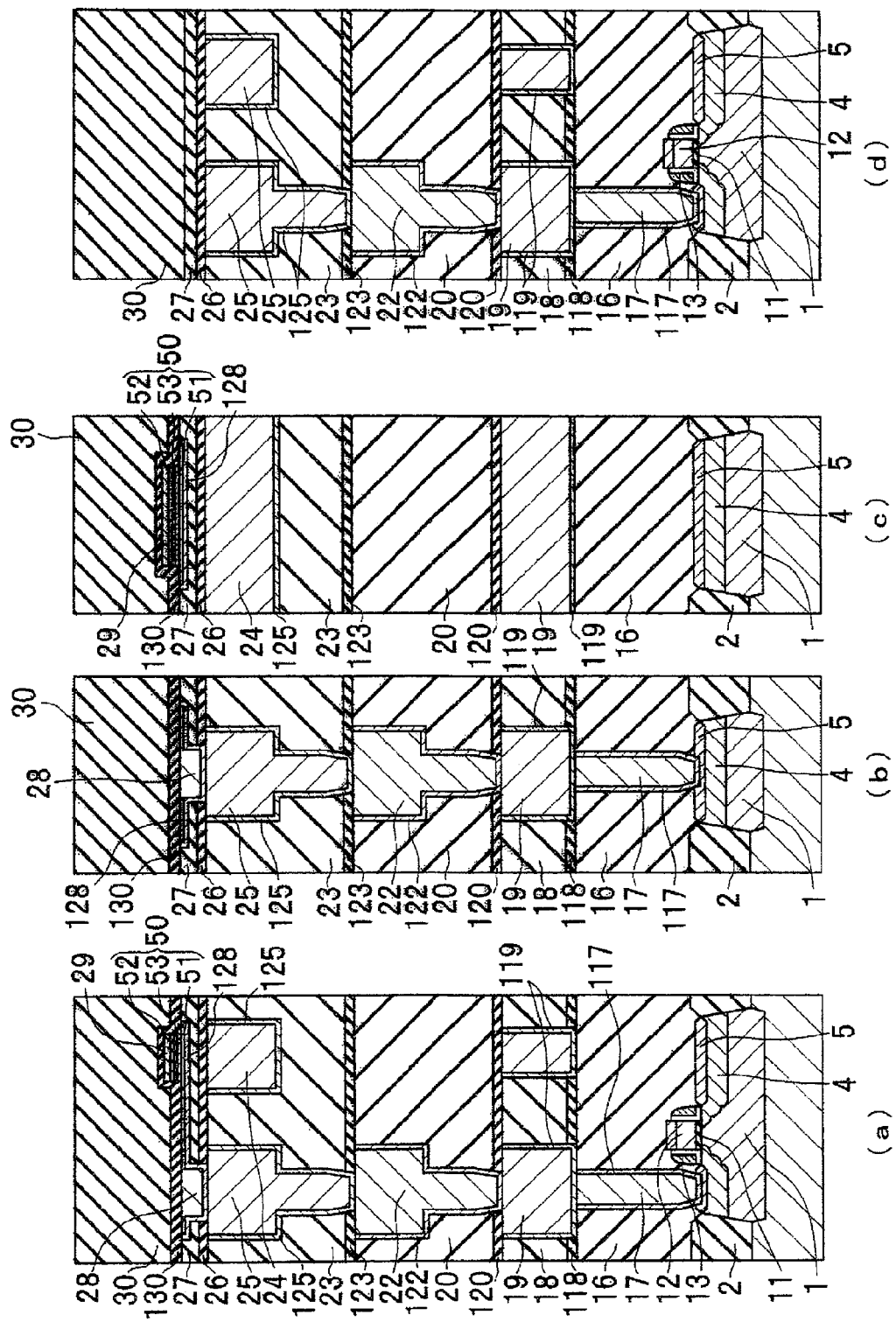
FIGS. 21(*a*) to 21(*d*) are cross-sectional views each showing a manufacturing process of the MRAM in accordance with embodiment 1 of the present invention.
Figure 22:
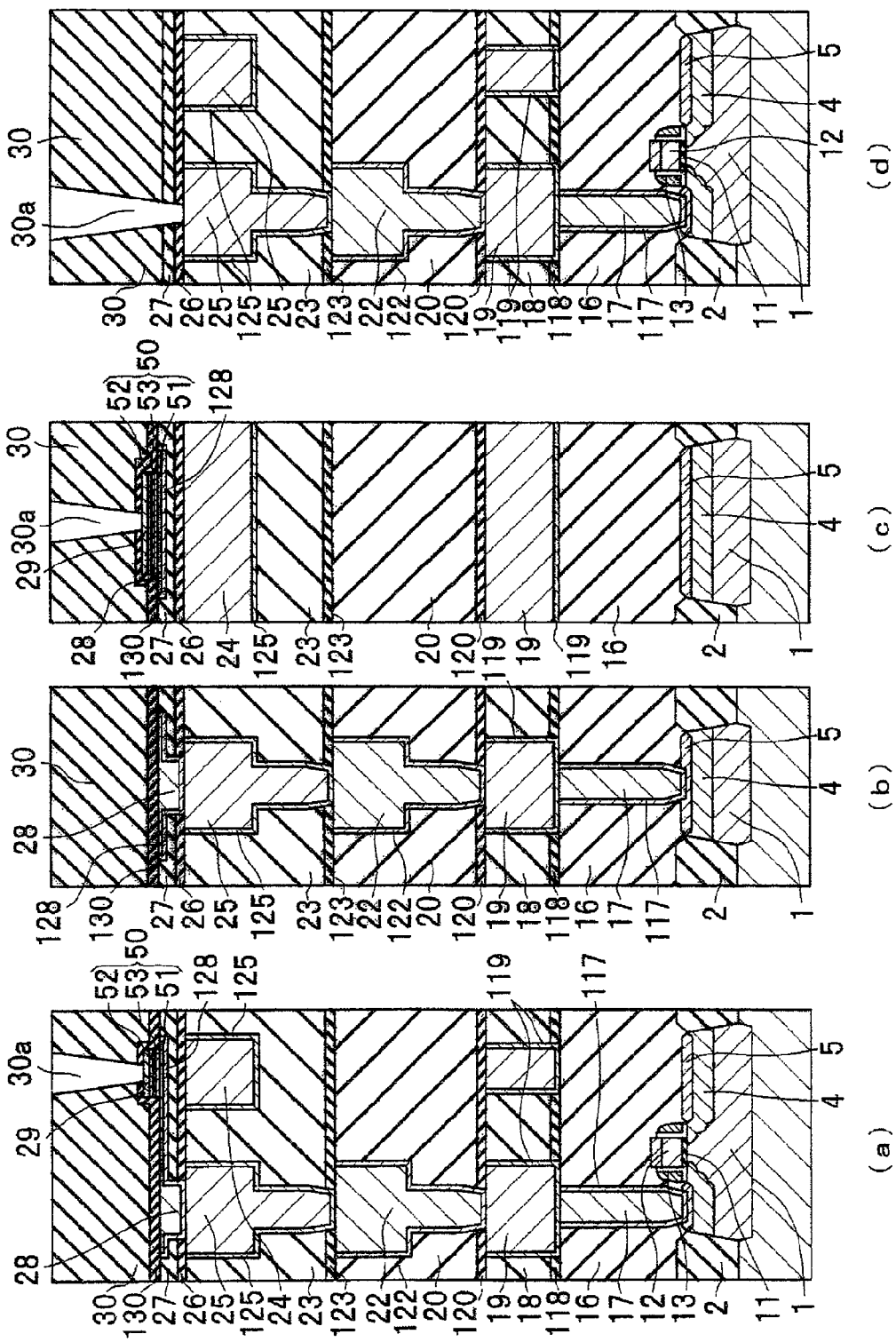
FIGS. 22(*a*) to 22(*d*) are cross-sectional views each showing a manufacturing process of the MRAM in accordance with embodiment 1 of the present invention.
Figure 23:
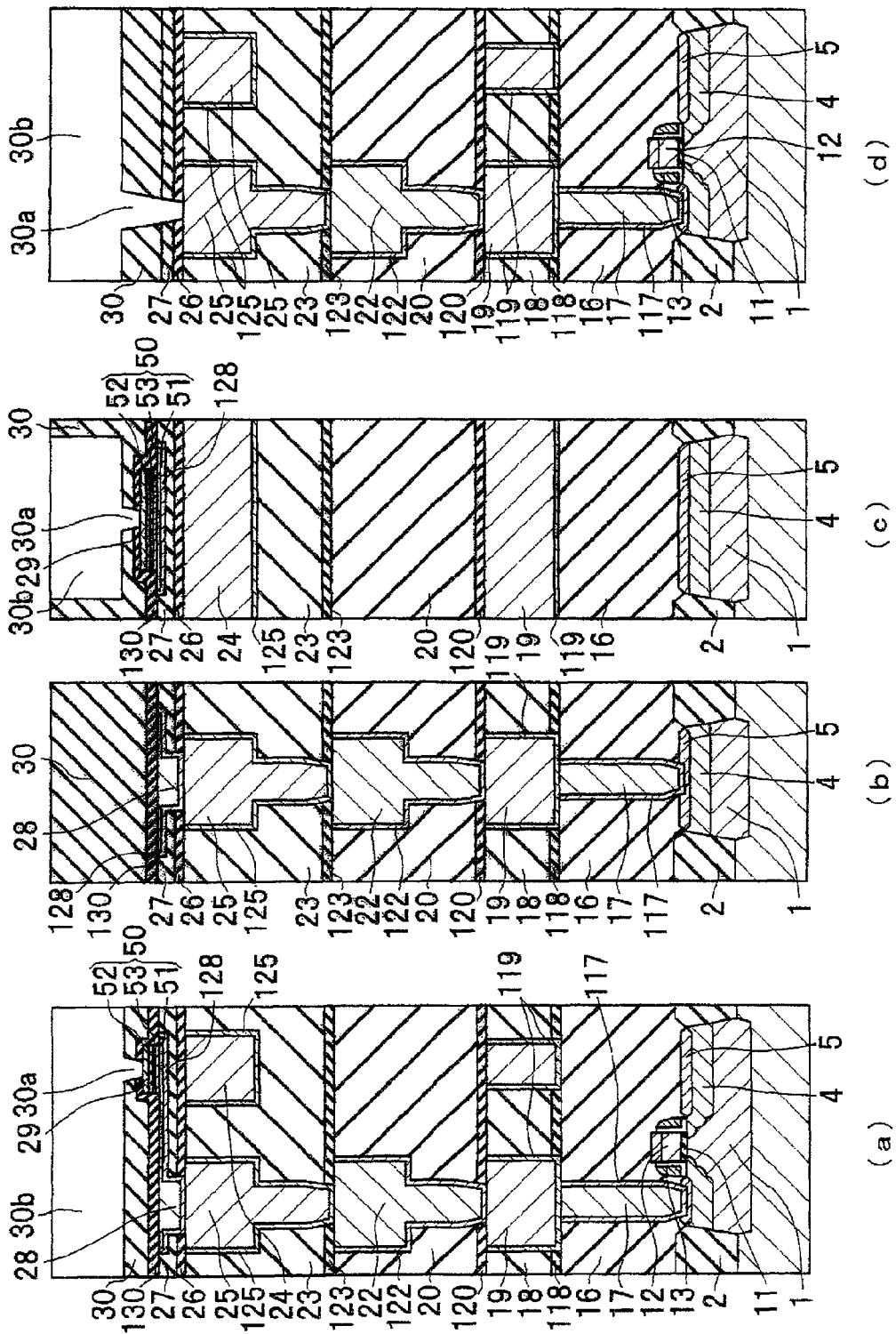
FIGS. 23(*a*) to 23(*d*) are cross-sectional views each showing a manufacturing process of the MRAM in accordance with embodiment 1 of the present invention.
Figure 24:
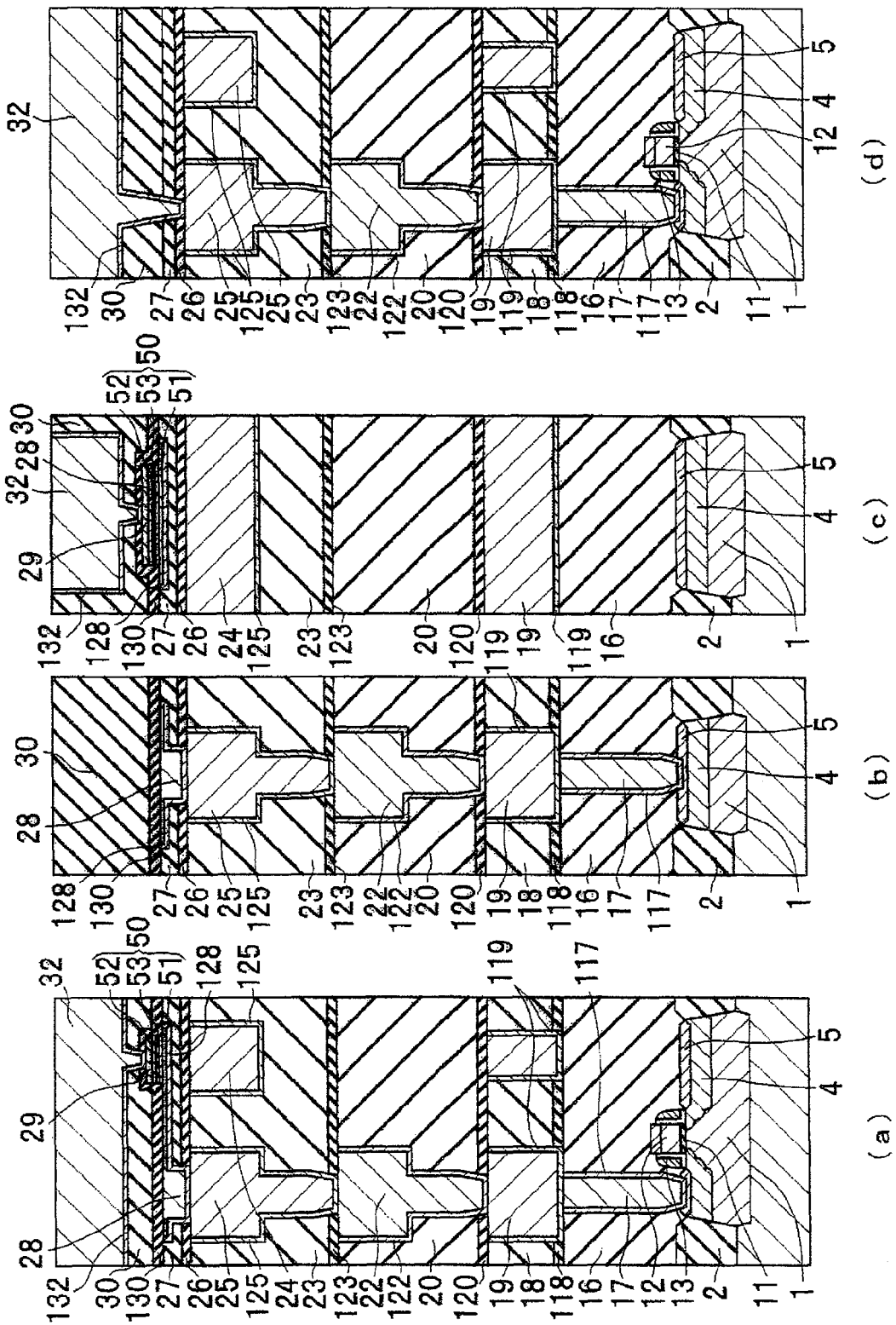
FIGS. 24(*a*) to 24(*d*) are cross-sectional views each showing a manufacturing process of the MRAM in accordance with embodiment 1 of the present invention.
Figure 25:
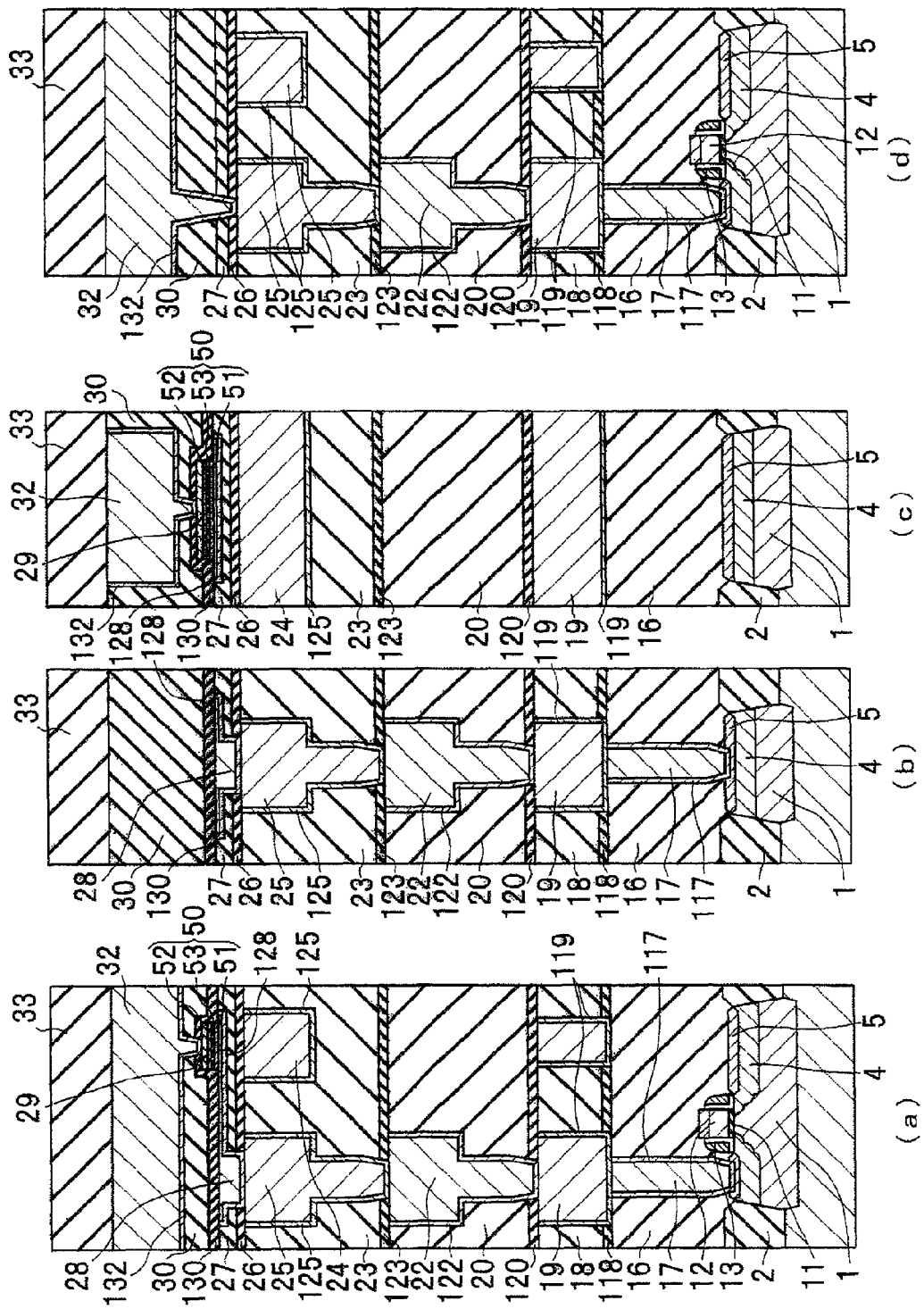
FIGS. 25(*a*) to 25(*d*) are cross-sectional views each showing a manufacturing process of the MRAM in accordance with embodiment 1 of the present invention.
Figure 26:
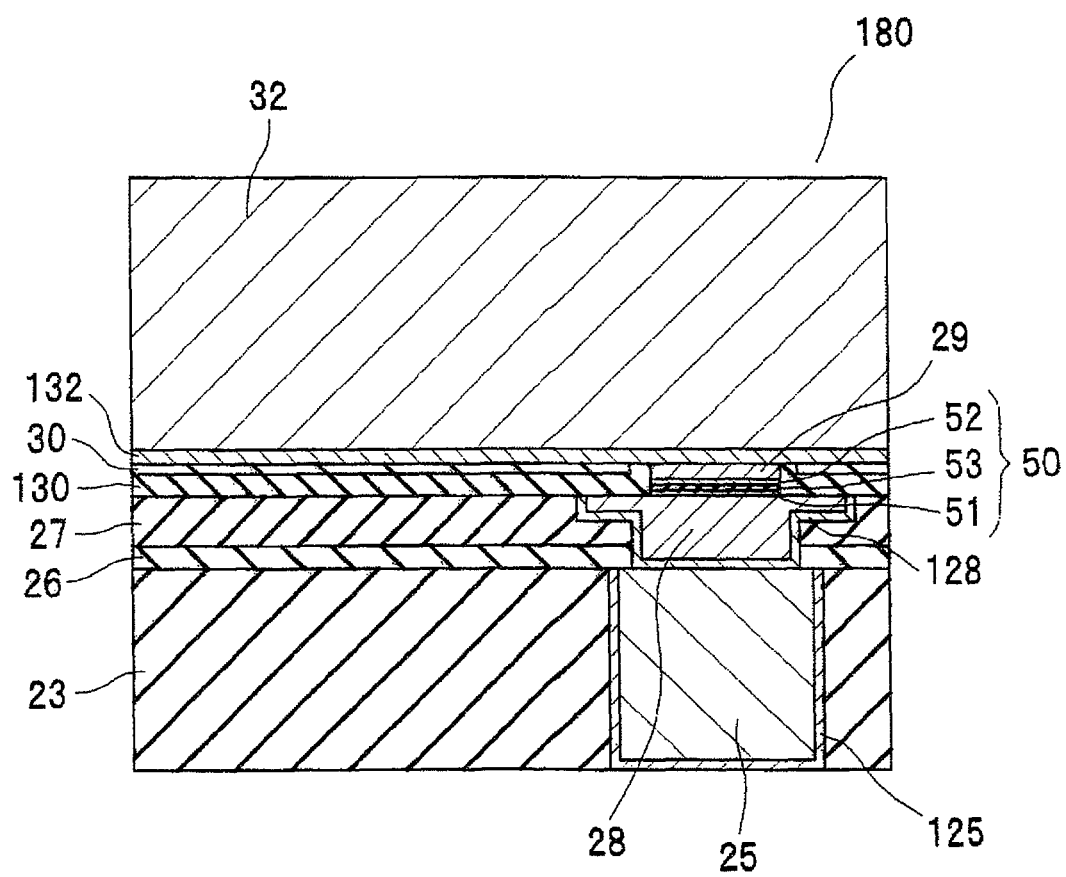
FIG. 26 is an enlarged view showing a memory cell of an STT-RAM in accordance with embodiment 1 of the present invention.
Figure 27:
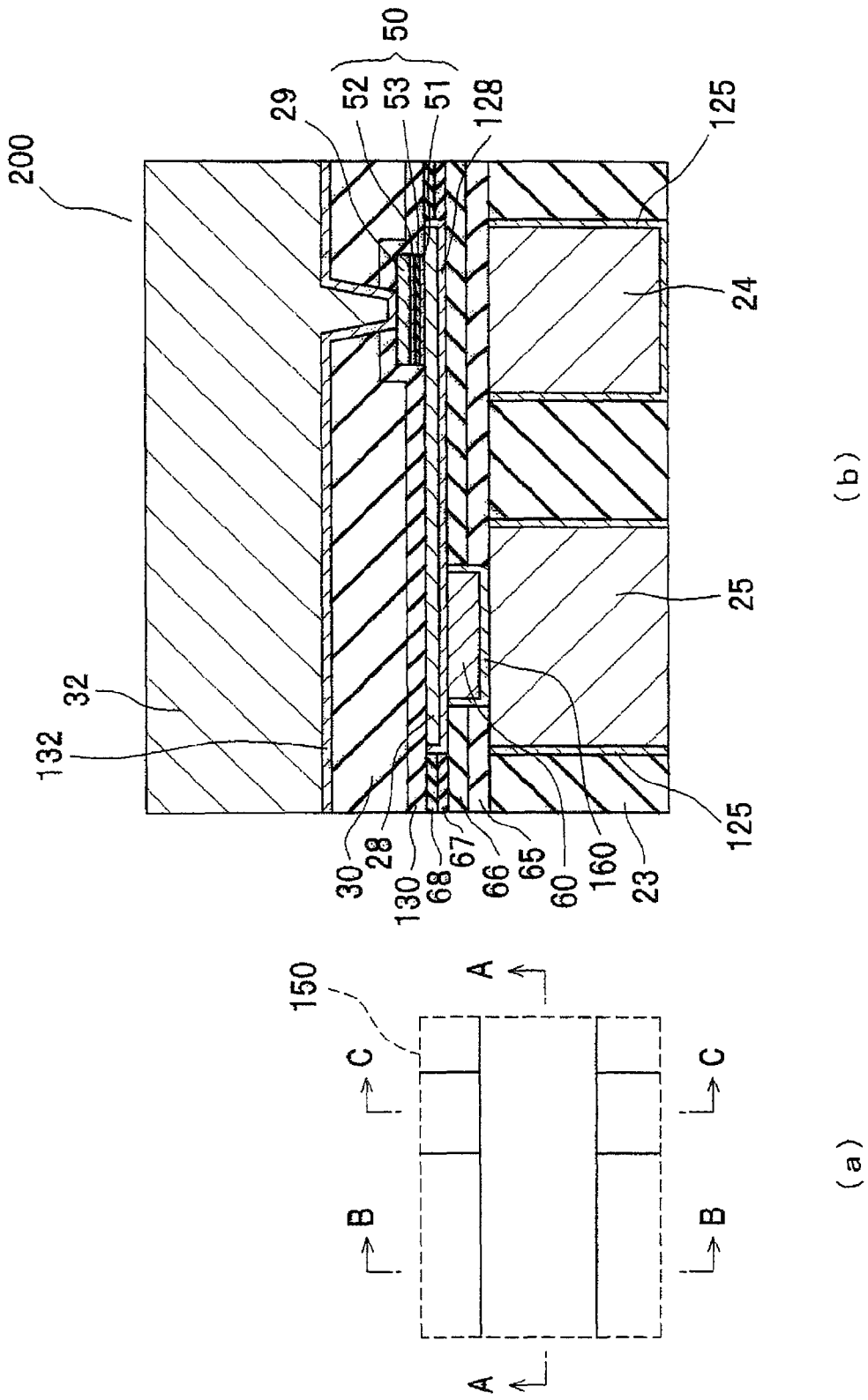
FIGS. 27(*a*) and 27(*b*) are enlarged views each showing a memory cell of an MRAM in accordance with embodiment 2 of the present invention.
Figure 28:
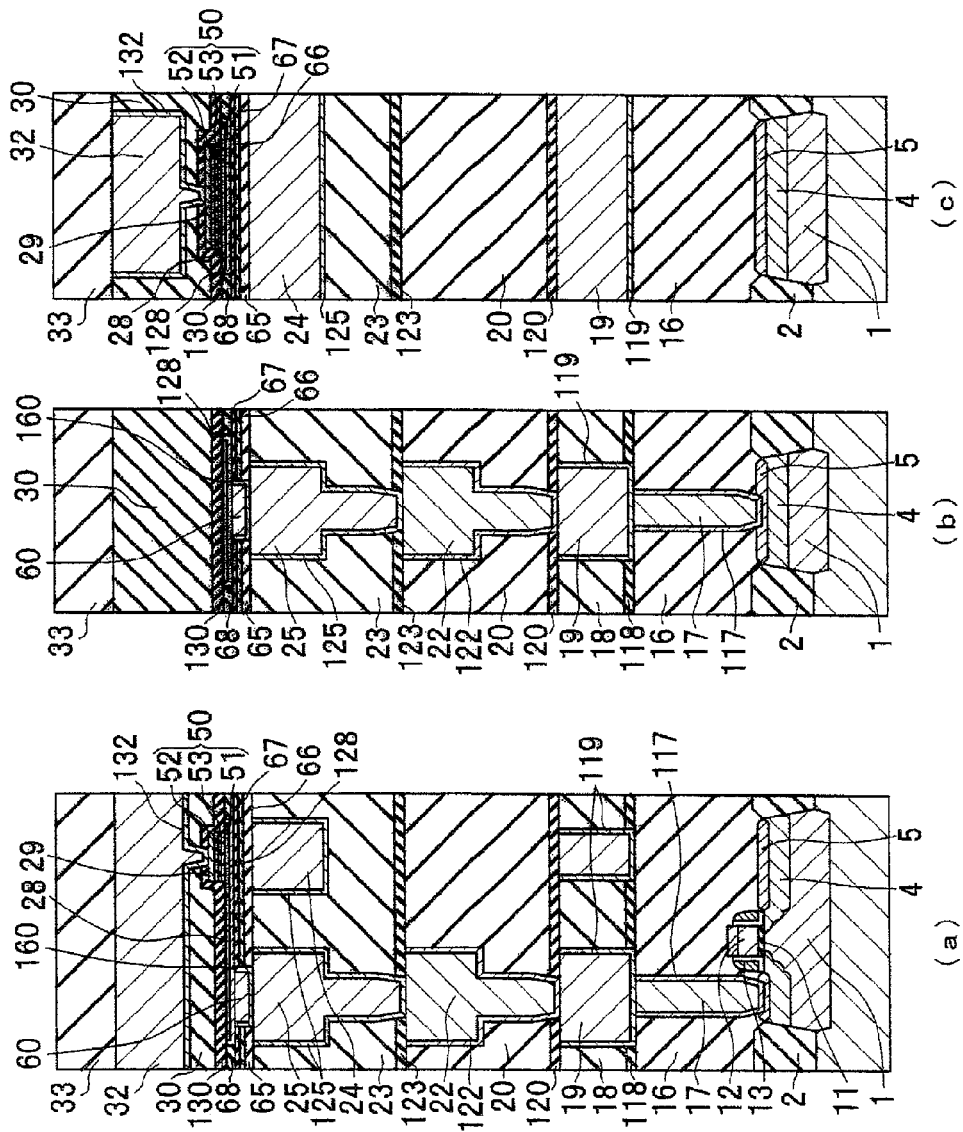
FIGS. 28(*a*) to 28(*c*) are cross-sectional views of the MRAM in accordance with embodiment 2 of the present invention.
Figure 29:
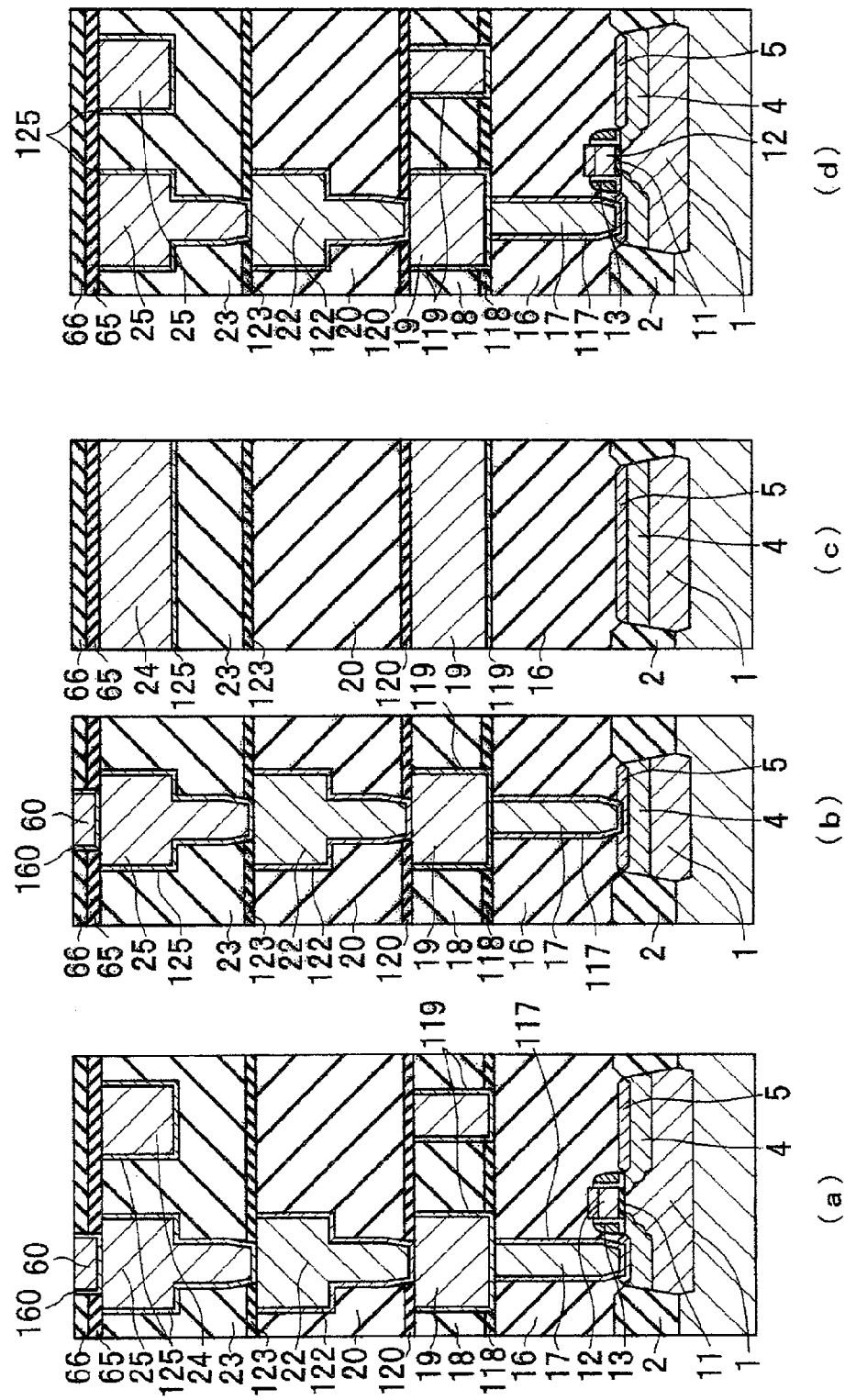
FIGS. 29(*a*) to 29(*d*) are cross-sectional views of the MRAM in accordance with embodiment 2 of the present invention.
Figure 30:
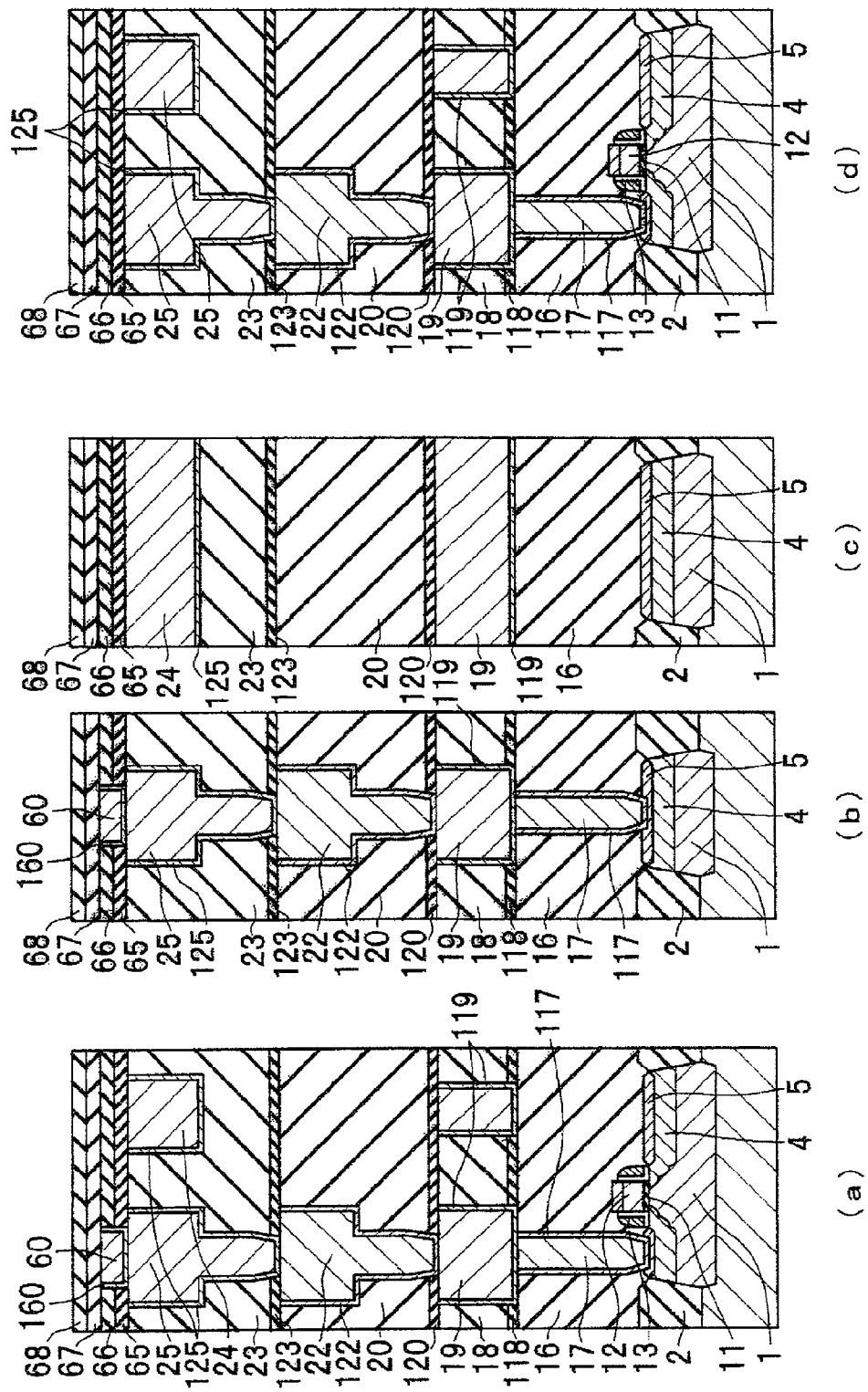
FIGS. 30(*a*) to 30(*d*) are cross-sectional views of the MRAM in accordance with embodiment 2 of the present invention.
Figure 31:
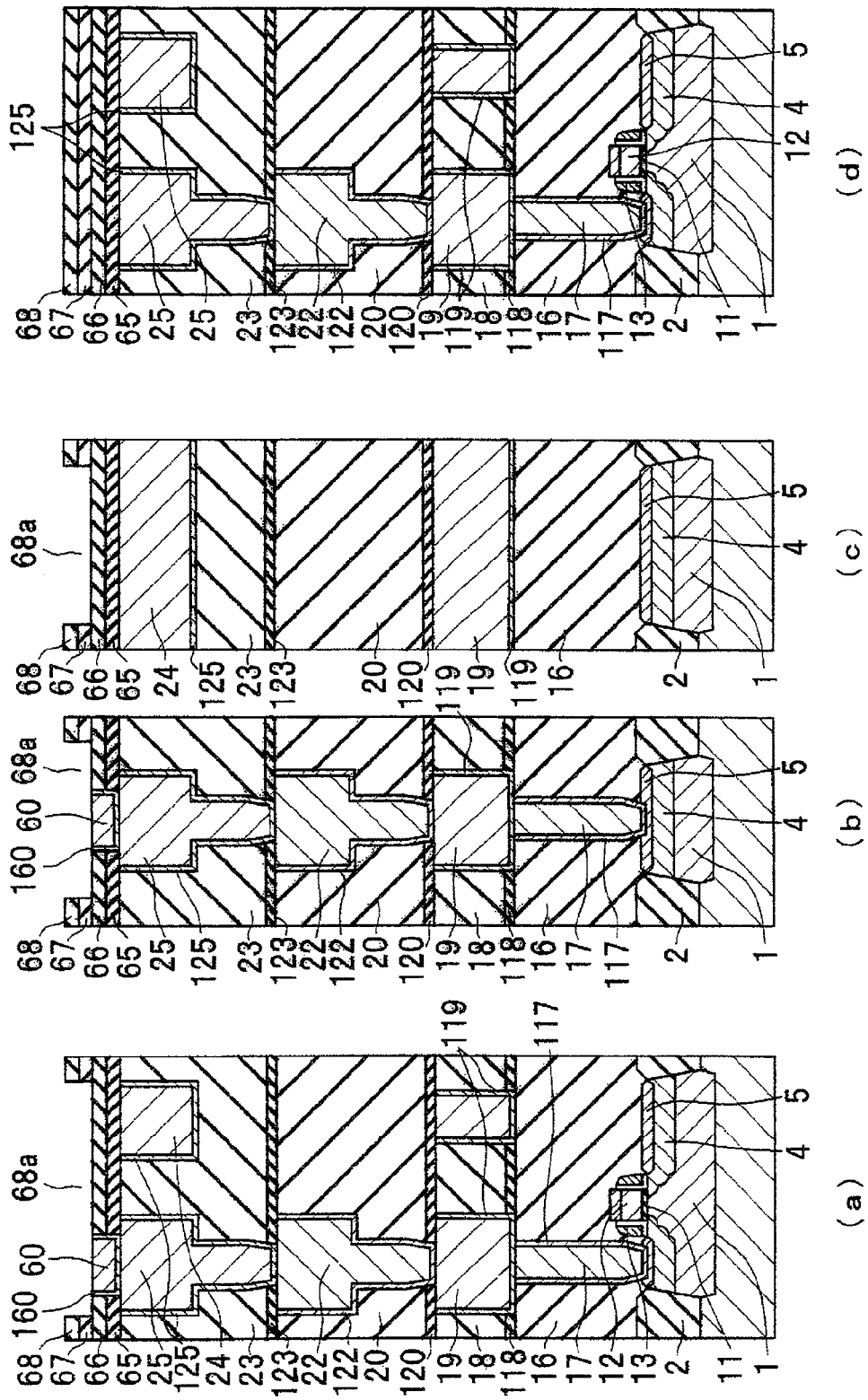
FIGS. 31(*a*) to 31(*d*) are cross-sectional views of the MRAM in accordance with embodiment 2 of the present invention.
Figure 32:
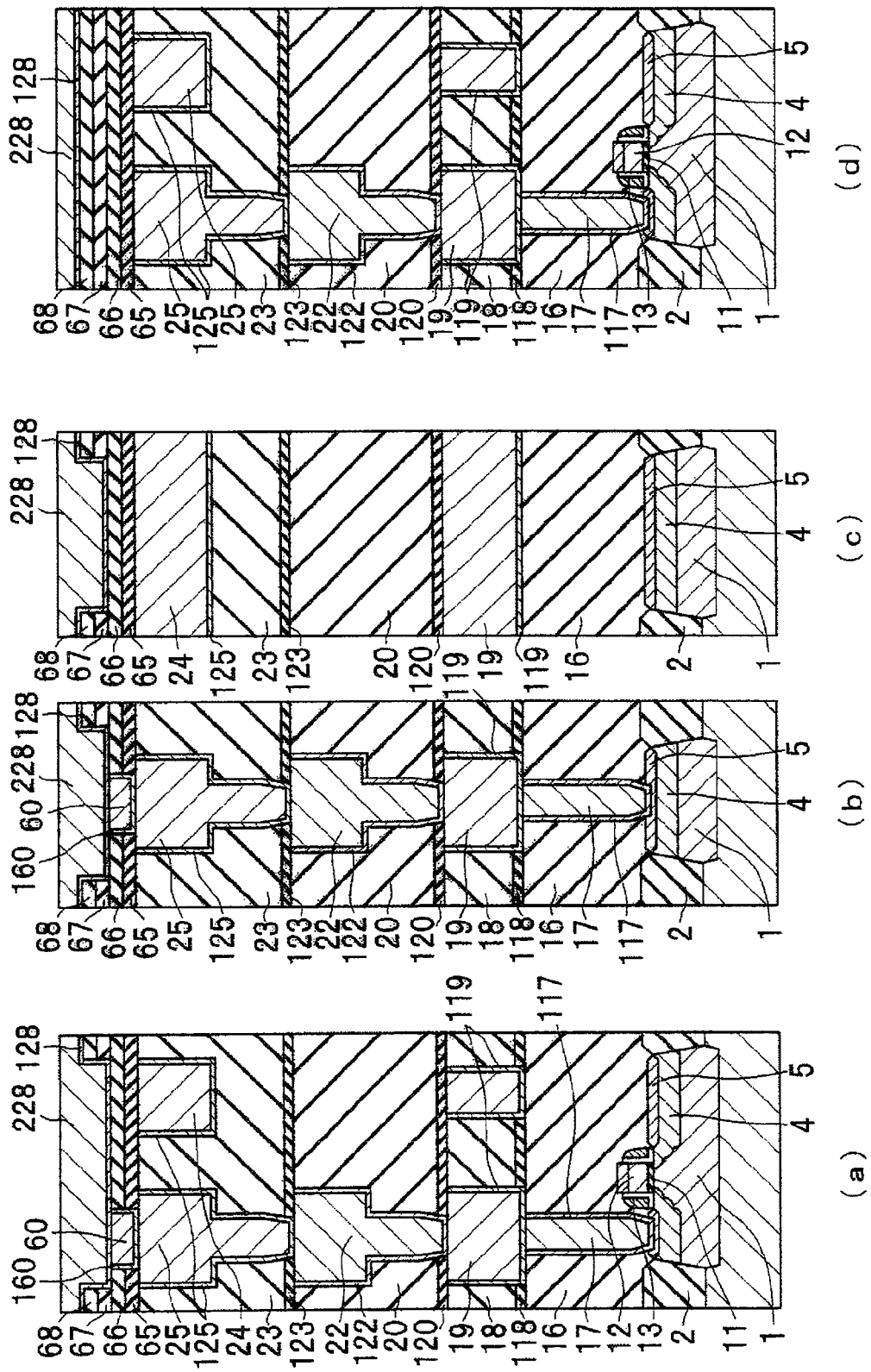
FIGS. 32(*a*) to 32(*d*) are cross-sectional views of the MRAM in accordance with embodiment 2 of the present invention.
Figure 33:
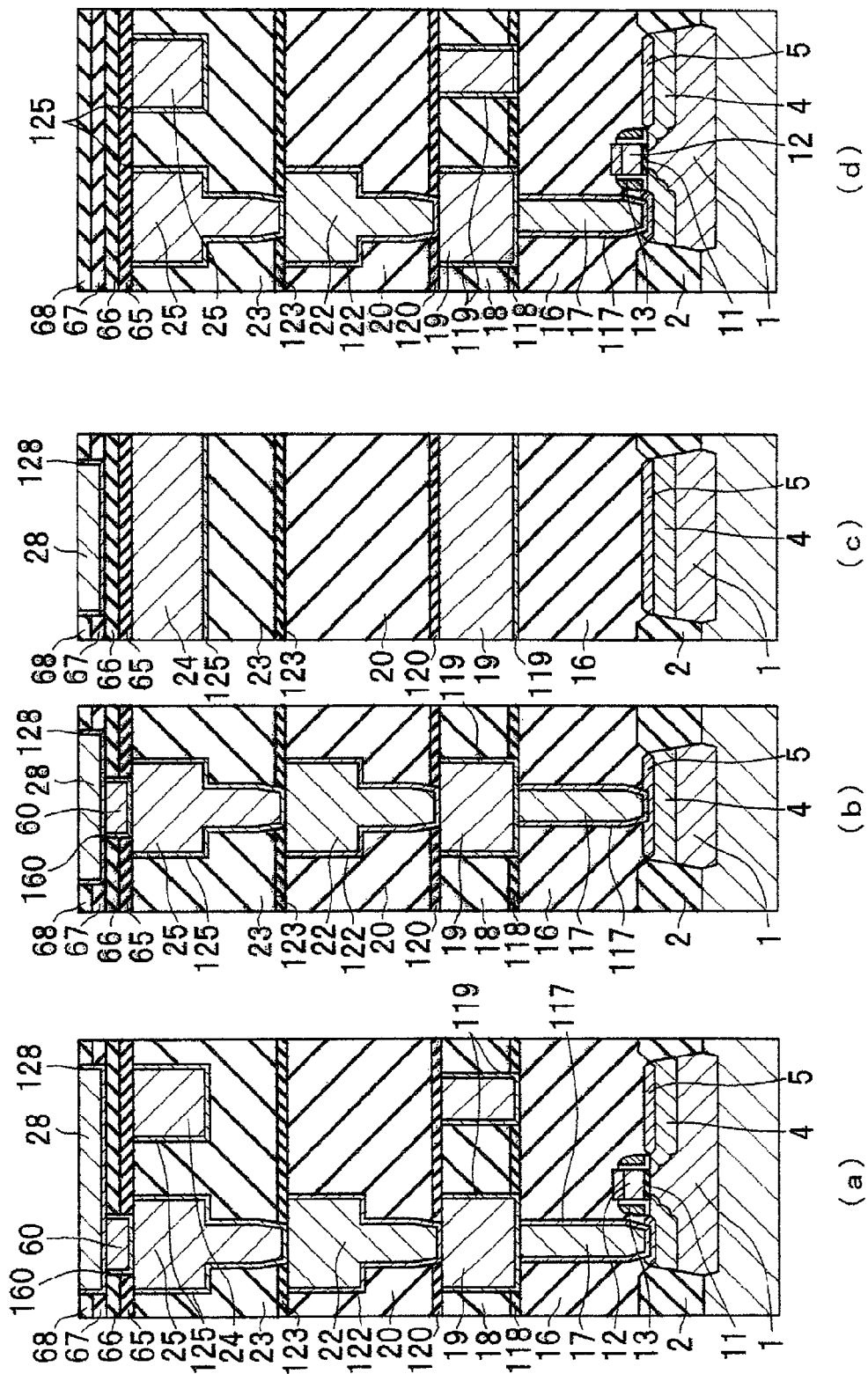
FIGS. 33(*a*) to 33(*d*) are cross-sectional views of the MRAM in accordance with embodiment 2 of the present invention.
Figure 34:
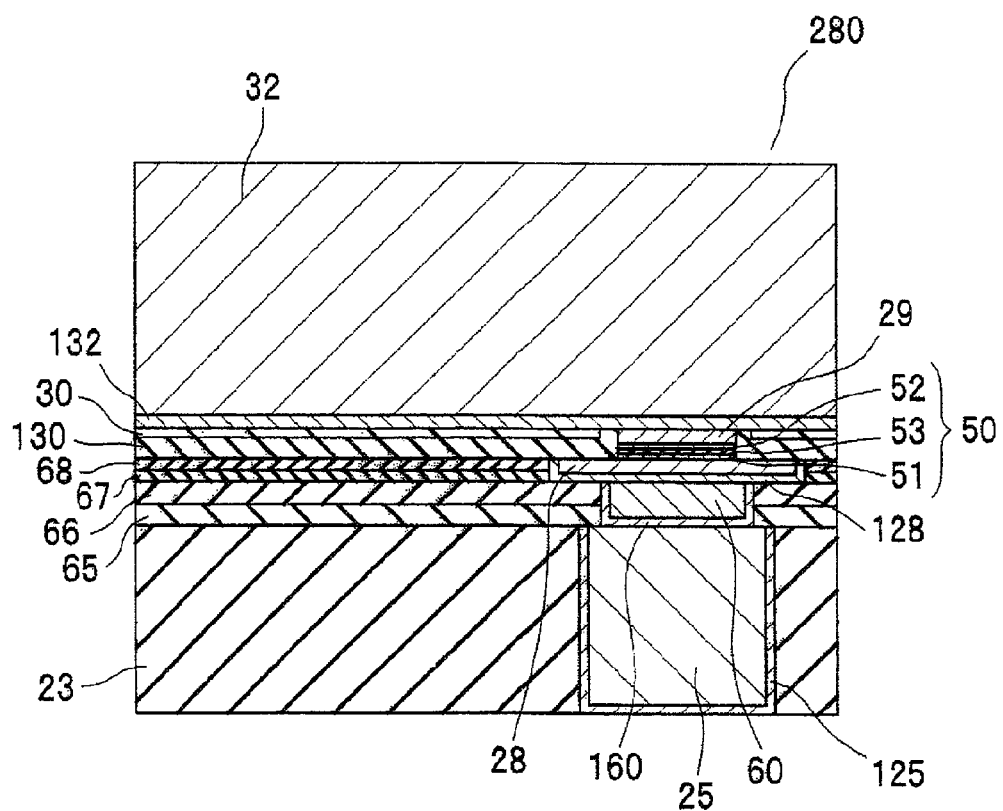
FIG. 34 is an enlarged view showing a memory cell of an STT-RAM in accordance with embodiment 2 of the present invention.
Figure 35:
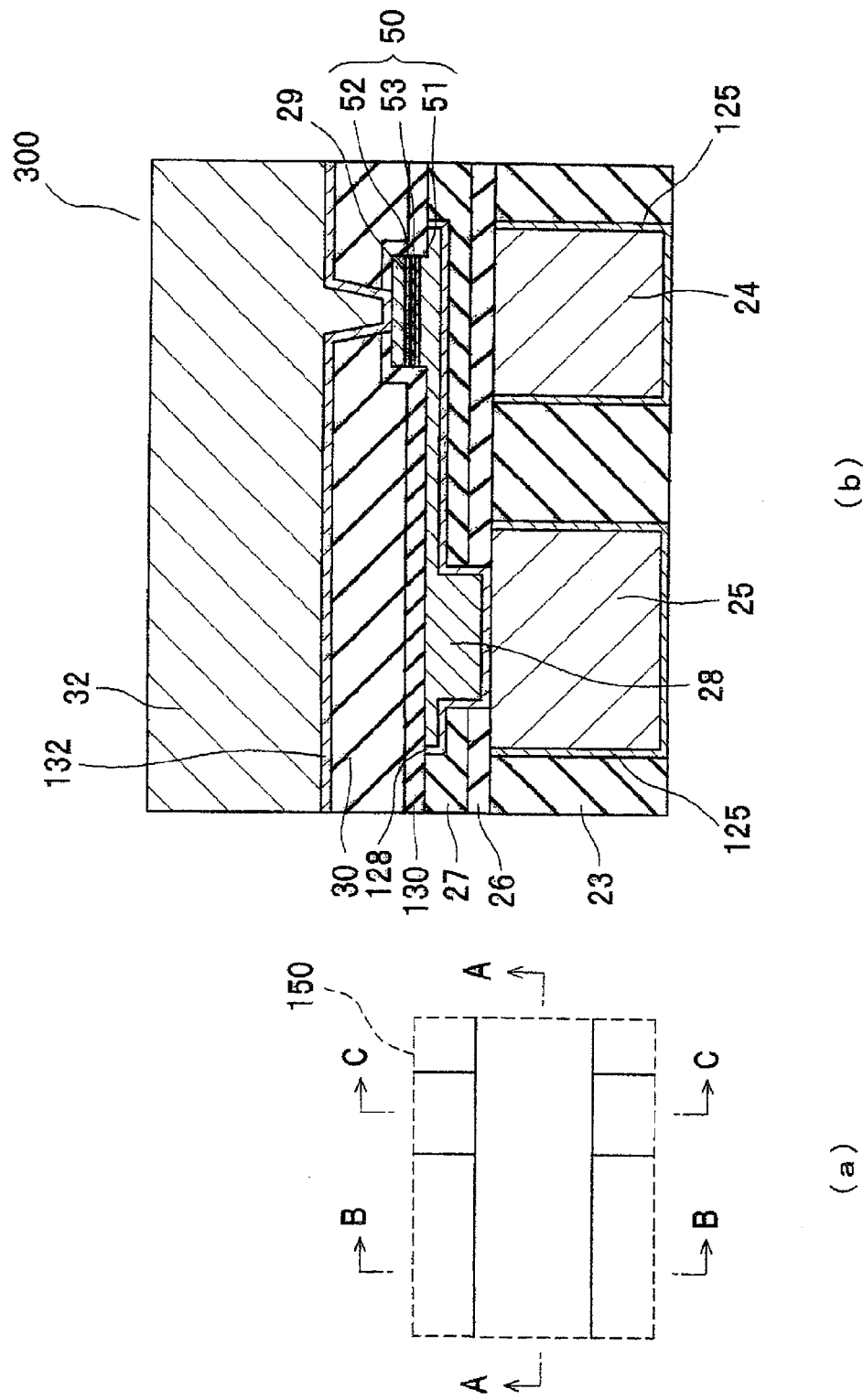
FIGS. 35(*a*) and 35(*b*) are enlarged views each showing a memory cell of an MRAM in accordance with embodiment 3 of the present invention.
Figure 36:
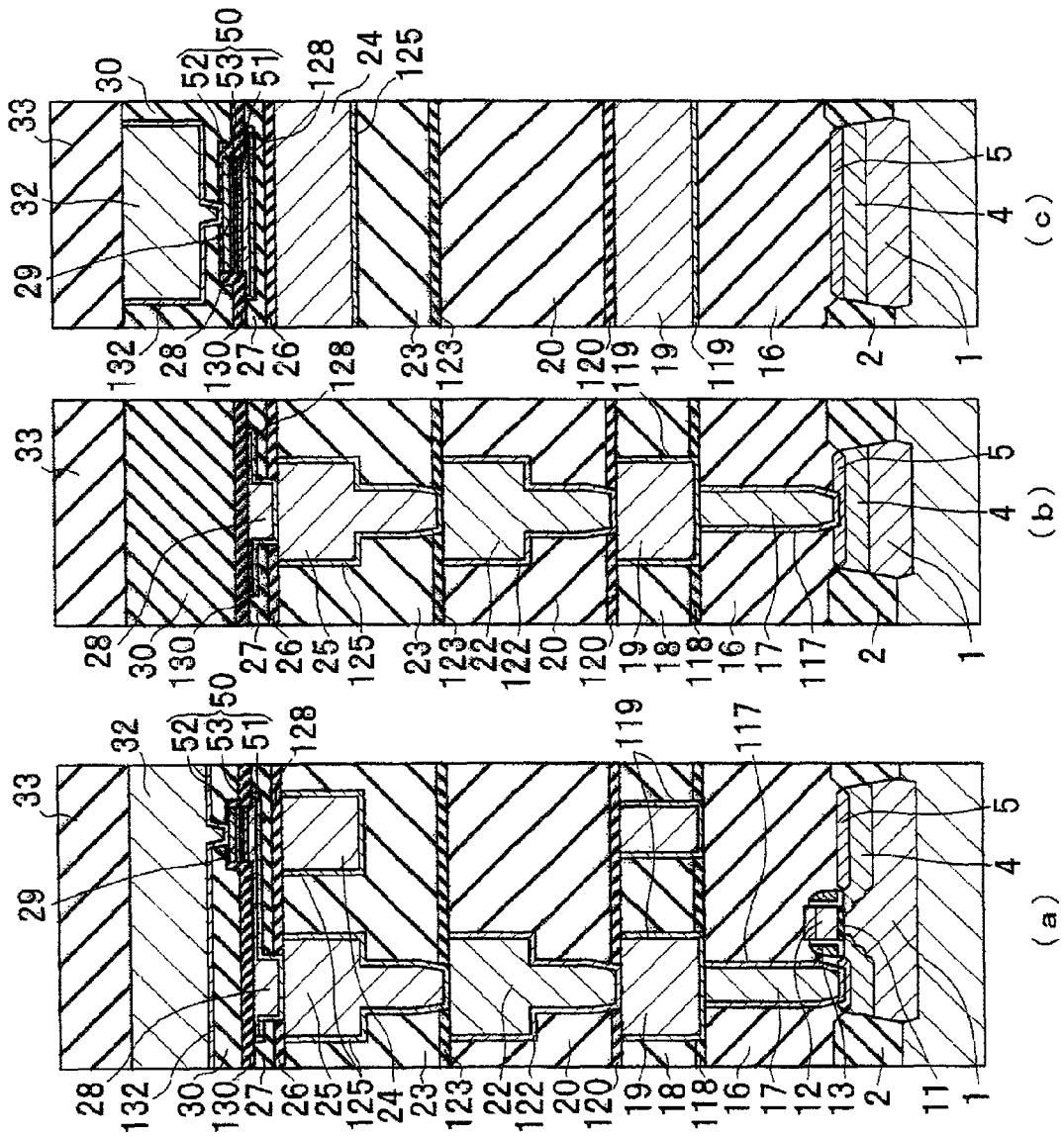
FIGS. 36(*a*) to 36(*c*) are cross-sectional views of the MRAM in accordance with embodiment 3.
Figure 37:
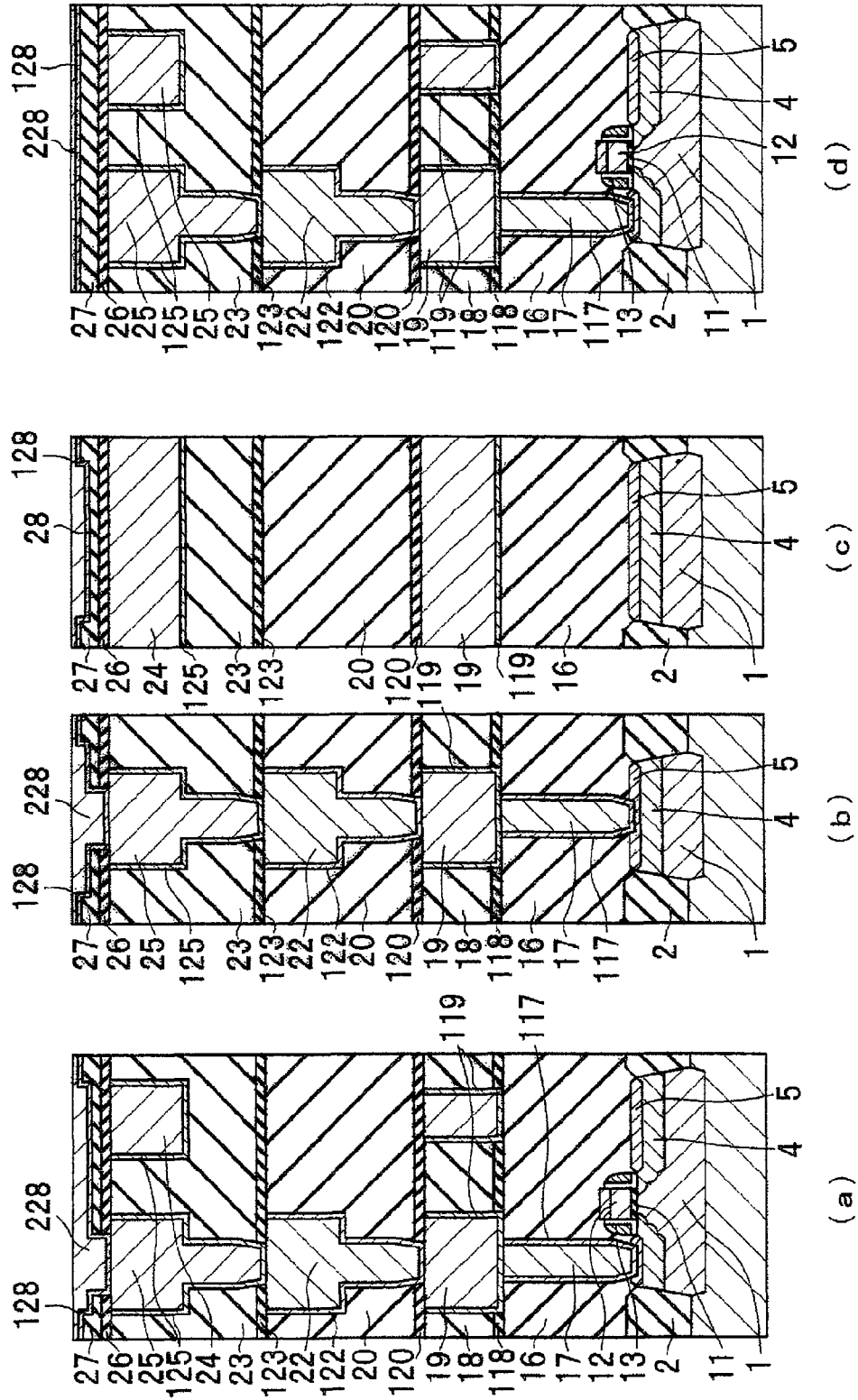
FIGS. 37(*a*) to 37(*d*) are cross-sectional views of the MRAM in accordance with embodiment 3 of the present invention.
Figure 38:
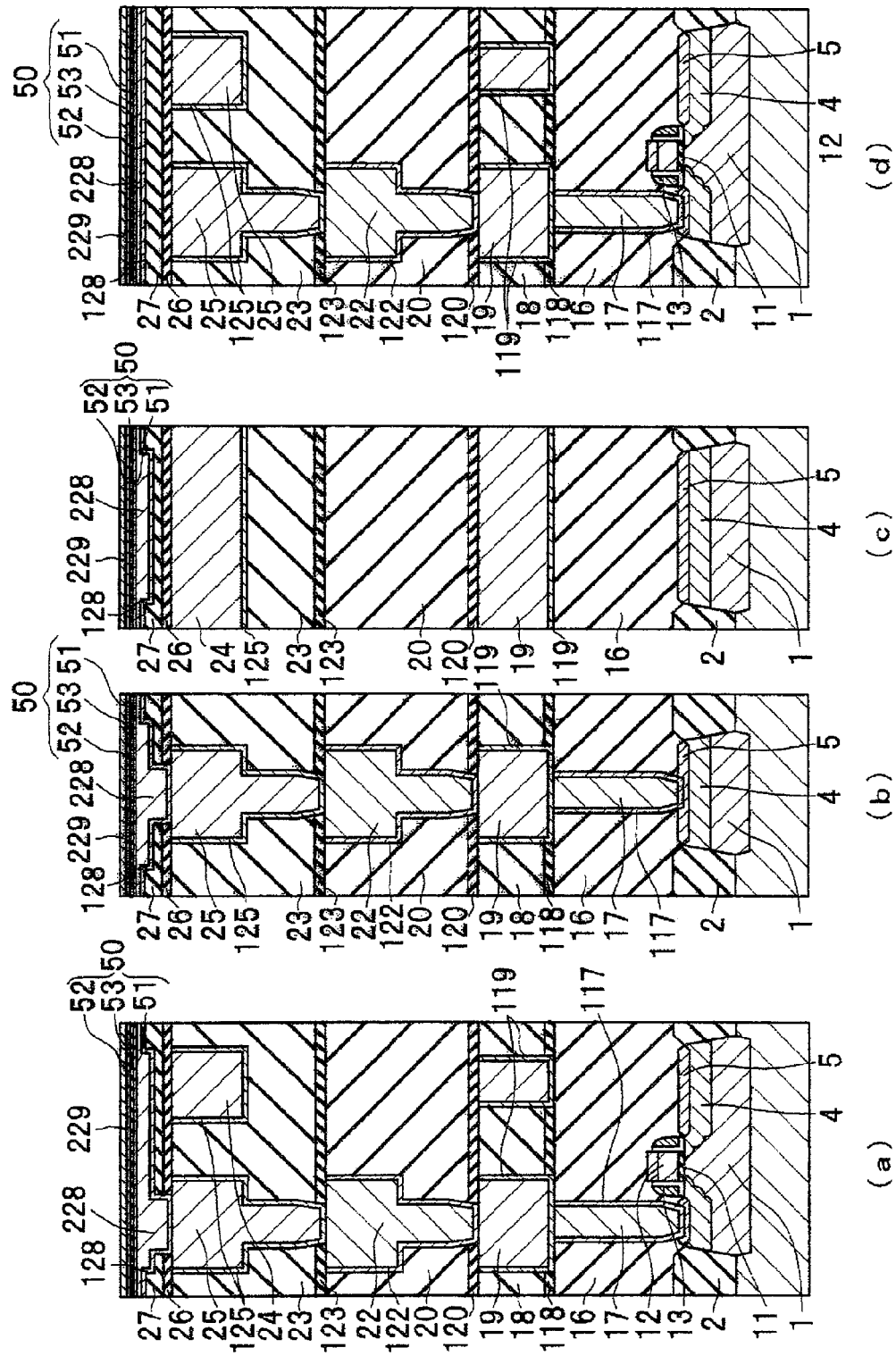
FIGS. 38(*a*) to 38(*d*) are cross-sectional views of the MRAM in accordance with embodiment 3 of the present invention.
Figure 39:
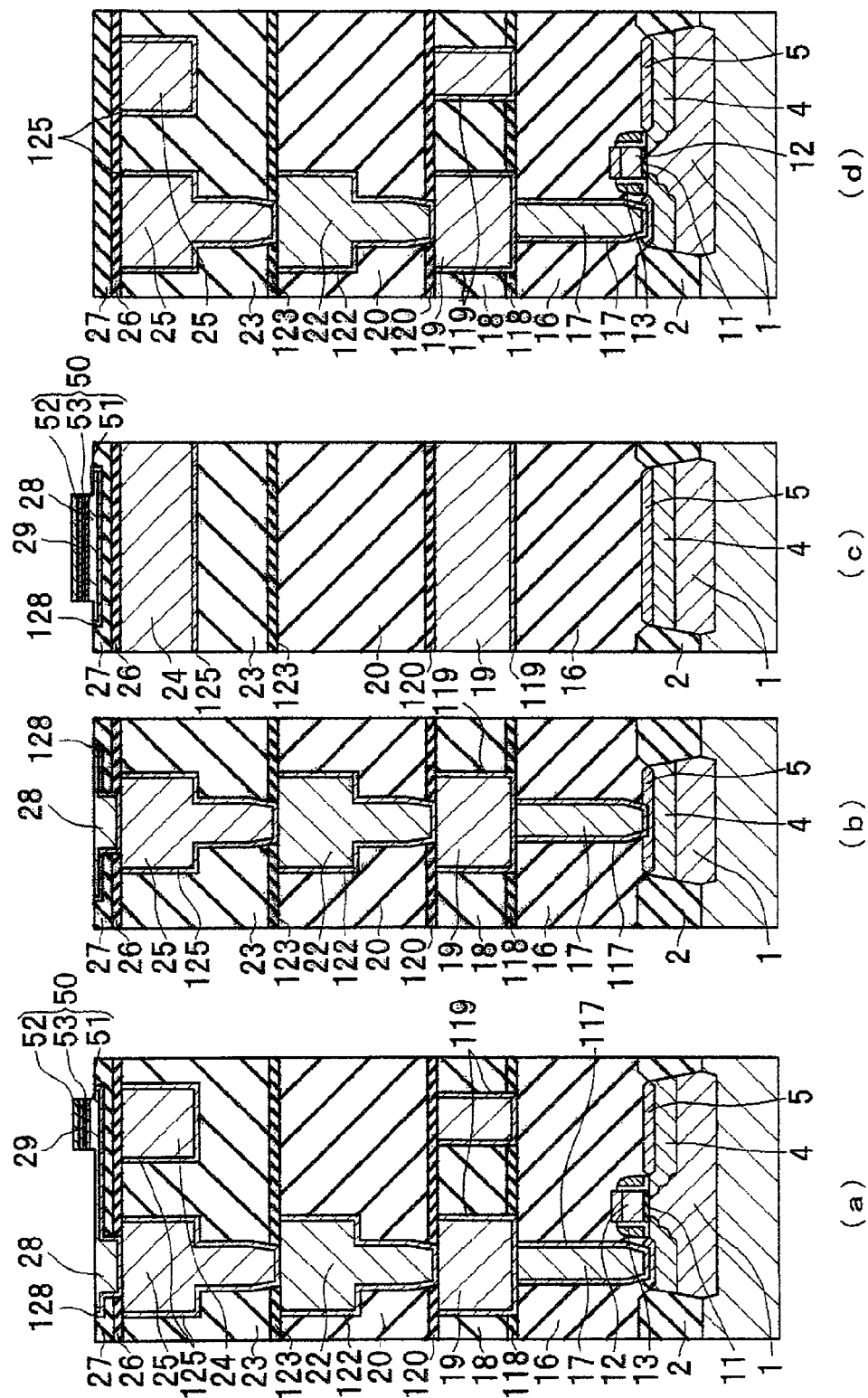
FIGS. 39(*a*) to 39(*d*) are cross-sectional views of the MRAM in accordance with embodiment 3 of the present invention.
Figure 40:
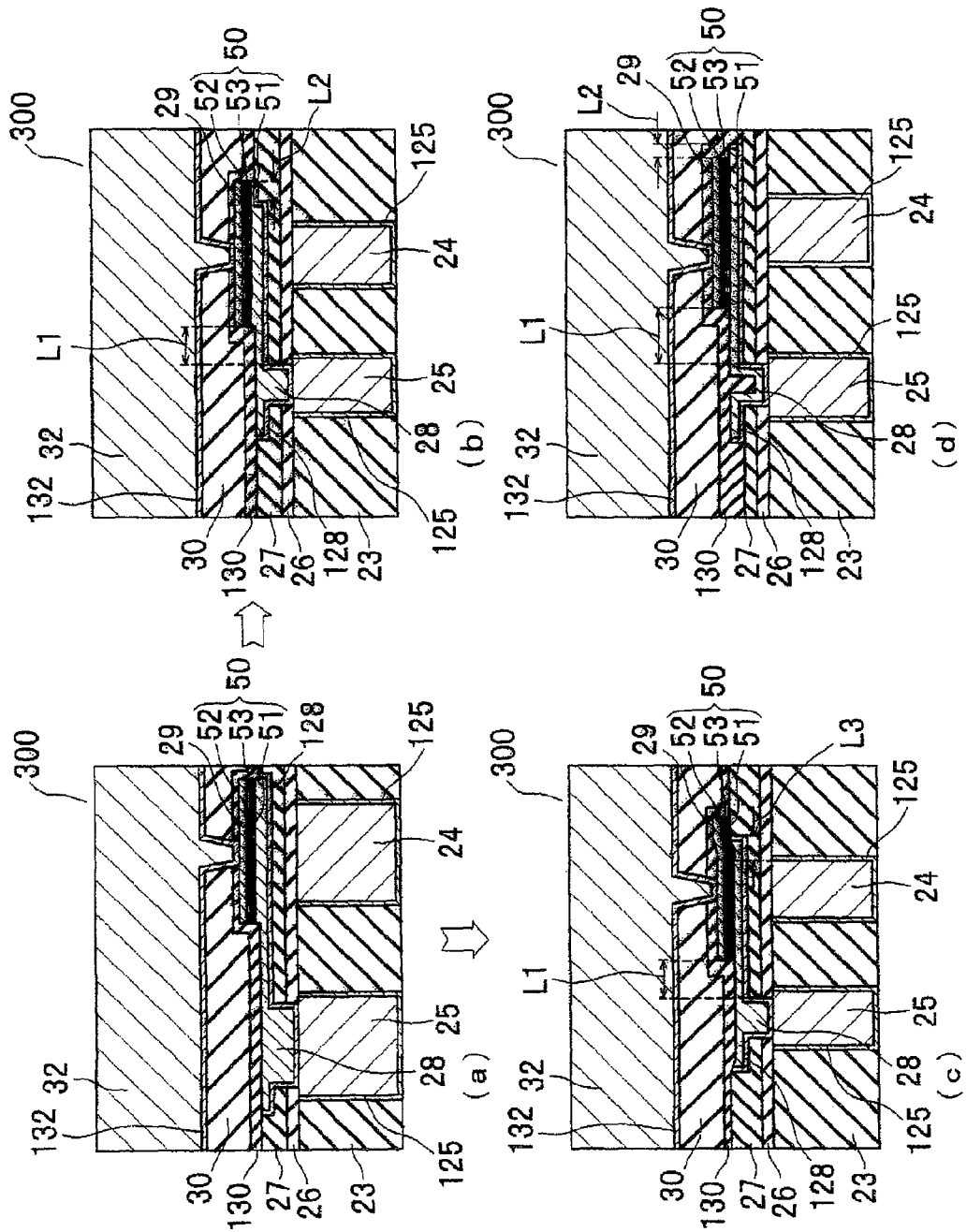
FIGS. 40(*a*) to 40(*d*) are cross-sectional views that describe features of the MRAM in accordance with embodiment 3 of the present invention.
Figure 41:
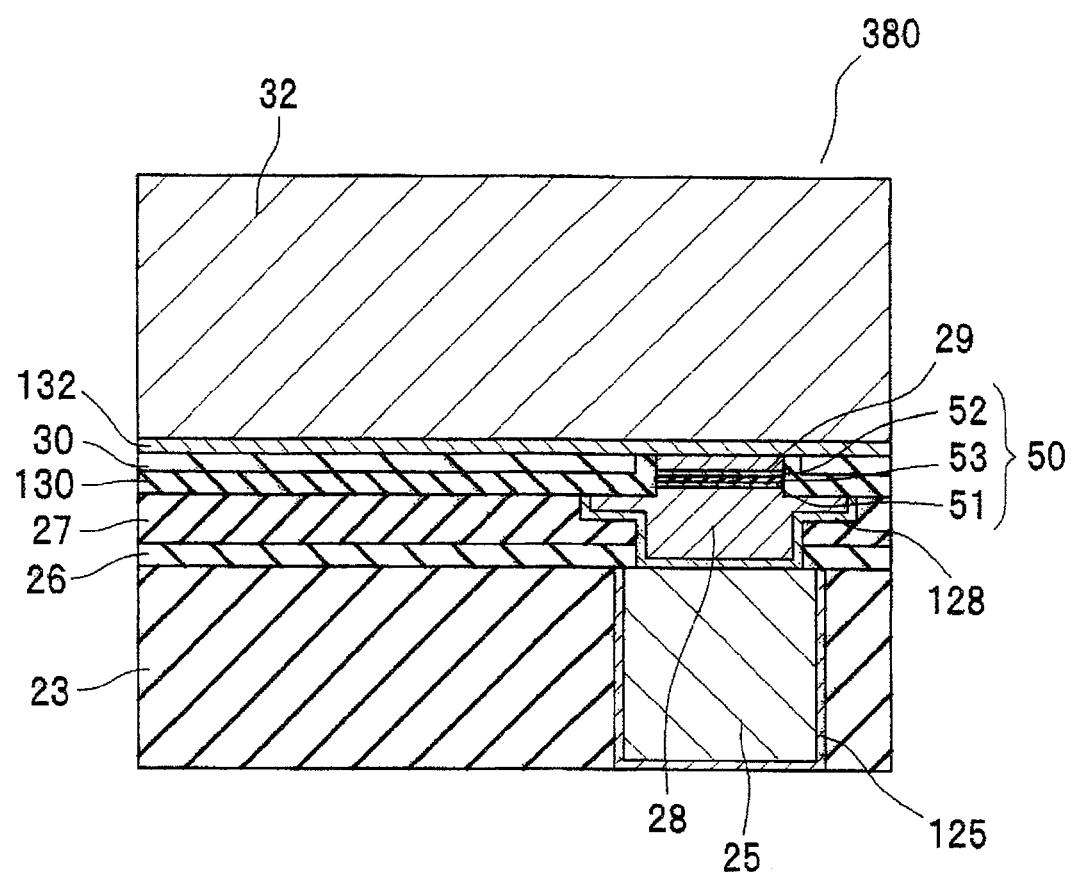
FIG. 41 is an enlarged view showing a memory cell of an STT-RAM in accordance with embodiment 3 of the present invention.
Figure 42:
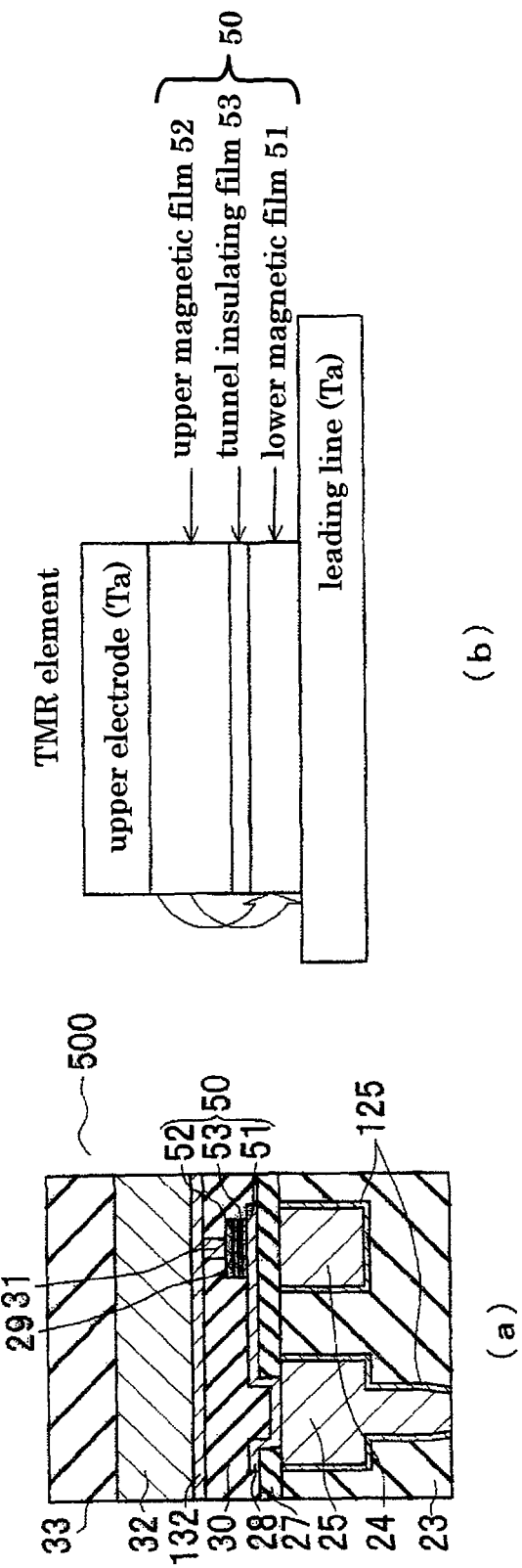
FIGS. 42(*a*) and 42(*b*) are cross-sectional views each showing a conventional MRAM.

23 Interlayer insulating film, 25 Wiring layer (digit line), 26, 27 Interlayer insulating film, 28 Lower electrode, 29

Upper electrode, 30 Interlayer insulating film, 32 Wiring layer (bit line), 50 TMR element, 51 Lower magnetic film, 52 Upper magnetic film, 53 Tunnel insulating film, 100 MRAM, 125, 128, 132 Barrier metal layer

The invention claimed is:

1. A method for manufacturing a magnetic storage device having a TMR element, the method comprising the steps of:
    forming an insulating film on an interlayer insulating film provided with a wiring layer;
    forming an opening in the insulating film so that the wiring layer is exposed therefrom;
    forming a metal layer on the insulating film so that the opening is filled therewith;
    polishing and removing the metal layer on the insulating film by a CMP method so that the surface of the insulating film is exposed and forming the metal layer remaining in the opening into a lower electrode; and
    forming a TMR element on the lower electrode,
    wherein the forming an opening step comprises a step of:
    after forming the first opening that reaches the surface of the wiring layer from the surface of the insulating film, forming a second opening that communicates with the first opening and has an opening area larger than that of the first opening, from the surface of the insulating film to the middle of the insulating film.

2. The method for manufacturing a magnetic storage device according to claim 1, further comprising the step of:
    forming a barrier metal layer so as to cover the inner face of the opening and the surface of the insulating film, between the opening step and the metal layer forming step.

* * * * *

UNITED STATES PATENT AND TRADEMARK OFFICE
CERTIFICATE OF CORRECTION

PATENT NO. : 8,546,151 B2  Page 1 of 1
APPLICATION NO. : 12/528854
DATED : October 1, 2013
INVENTOR(S) : Furuta et al.

It is certified that error appears in the above-identified patent and that said Letters Patent is hereby corrected as shown below:

On the title page

Item (73) Assignee

"Renesas Electronics Corporation, Kanagawa (JP)" should read --Renesas Electronics Corporation, Kanagawa (JP) and Grandis, Inc., Milpitas, CA.--.

Signed and Sealed this
Eleventh Day of August, 2015

Michelle K. Lee
*Director of the United States Patent and Trademark Office*